(12) United States Patent
Zhong et al.

(10) Patent No.: US 7,196,415 B2
(45) Date of Patent: Mar. 27, 2007

(54) LOW VOLTAGE DROP AND HIGH THERMAL PERFORMANCE BALL GRID ARRAY PACKAGE

(75) Inventors: Chong Hua Zhong, Irvine, CA (US); Reza-ur Rahman Khan, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 495 days.

(21) Appl. No.: 10/253,600

(22) Filed: Sep. 25, 2002

(65) Prior Publication Data

US 2003/0179549 A1 Sep. 25, 2003

Related U.S. Application Data

(60) Provisional application No. 60/366,241, filed on Mar. 22, 2002.

(51) Int. Cl.
*H01L 23/34* (2006.01)

(52) U.S. Cl. .................. 257/712; 257/E23.08

(58) Field of Classification Search ............. 257/712, 257/713; 438/122; 361/688, 709, 710, 712
See application file for complete search history.

(56) References Cited

U.S. PATENT DOCUMENTS

| 3,790,866 | A | 2/1974 | Meyer et al. |
| 4,611,238 | A | 9/1986 | Lewis et al. |
| 5,045,921 | A | 9/1991 | Lin et al. |
| 5,065,281 | A | 11/1991 | Hernandez et al. |
| 5,173,766 | A | 12/1992 | Long et al. |
| 5,208,504 | A | 5/1993 | Parker et al. |
| 5,216,278 | A | 6/1993 | Lin et al. |

(Continued)

FOREIGN PATENT DOCUMENTS

EP 0 573 297 A2 12/1993

(Continued)

OTHER PUBLICATIONS http://thermal-compunds.globalspec.com, 1999-2005.*

(Continued)

*Primary Examiner*—David A. Zarneke
(74) *Attorney, Agent, or Firm*—Sterne, Kessler, Goldstein & Fox PLLC

(57) ABSTRACT

An apparatus and method for a low voltage drop and thermally enhanced integrated circuit (IC) package are described. A substantially planar substrate having a plurality of contact pads on a first surface is electrically connected through the substrate to a plurality of solder ball pads on a second surface of the substrate. An IC die having a first surface is mounted to the first surface of the substrate. The IC die has a plurality of I/O pads electrically connected to the plurality of contact pads on the first surface of the substrate. A heat sink assembly is coupled to a second surface of the IC die and to a first contact pad on the first surface of the substrate to provide a thermal path from the IC die to the first surface of the substrate. The heat sink assembly can also provide an electrical path from the IC die to the first surface of the substrate. The heat sink assembly may have one or two heat sink elements to provide thermal and/or electrical connectivity between the IC die and the substrate.

47 Claims, 31 Drawing Sheets

U.S. PATENT DOCUMENTS

| | | | |
|---|---|---|---|
| 5,285,352 A | 2/1994 | Pastore et al. | |
| 5,291,062 A | 3/1994 | Higgins, III | |
| 5,294,826 A | 3/1994 | Marcantonio et al. | |
| 5,366,589 A | 11/1994 | Chang | |
| 5,371,404 A * | 12/1994 | Juskey et al. | 257/659 |
| 5,394,009 A | 2/1995 | Loo | |
| 5,397,917 A | 3/1995 | Ommen et al. | |
| 5,397,921 A | 3/1995 | Karnezos | |
| 5,409,865 A | 4/1995 | Karnezos | |
| 5,433,631 A | 7/1995 | Beaman et al. | |
| 5,438,216 A | 8/1995 | Juskey et al. | |
| 5,474,957 A | 12/1995 | Urushima | |
| 5,490,324 A | 2/1996 | Newman | |
| 5,534,467 A | 7/1996 | Rostoker | |
| 5,541,450 A | 7/1996 | Jones et al. | |
| 5,552,635 A | 9/1996 | Kim et al. | |
| 5,572,405 A | 11/1996 | Wilson et al. | |
| 5,578,869 A | 11/1996 | Hoffman et al. | |
| 5,583,377 A | 12/1996 | Higgins, III | |
| 5,583,378 A | 12/1996 | Marrs et al. | |
| 5,642,261 A | 6/1997 | Bond et al. | |
| 5,648,679 A | 7/1997 | Chillara et al. | |
| 5,650,659 A | 7/1997 | Mostafazadeh et al. | |
| 5,650,662 A | 7/1997 | Edwards et al. | |
| 5,691,567 A | 11/1997 | Lo et al. | |
| 5,717,252 A | 2/1998 | Nakashima et al. | |
| 5,736,785 A | 4/1998 | Chiang et al. | |
| 5,744,863 A | 4/1998 | Culnane et al. | |
| 5,796,170 A | 8/1998 | Marcantonio | |
| 5,798,909 A | 8/1998 | Bhatt et al. | |
| 5,801,432 A | 9/1998 | Rostoker et al. | |
| 5,835,355 A | 11/1998 | Dordi | |
| 5,843,808 A | 12/1998 | Karnezos | |
| 5,844,168 A | 12/1998 | Schueller et al. | |
| 5,856,911 A | 1/1999 | Riley | |
| 5,866,949 A | 2/1999 | Schueller | |
| 5,883,430 A | 3/1999 | Johnson | |
| 5,889,321 A | 3/1999 | Culnane et al. | |
| 5,889,324 A | 3/1999 | Suzuki | |
| 5,894,410 A | 4/1999 | Barrow | |
| 5,895,967 A | 4/1999 | Stearns et al. | |
| 5,901,041 A | 5/1999 | Davies et al. | |
| 5,903,052 A | 5/1999 | Chen et al. | |
| 5,905,633 A | 5/1999 | Shim et al. | |
| 5,907,189 A | 5/1999 | Mertol | |
| 5,907,903 A | 6/1999 | Ameen et al. | |
| 5,920,117 A | 7/1999 | Sono et al. | |
| 5,949,137 A | 9/1999 | Domadia et al. | |
| 5,953,589 A | 9/1999 | Shim et al. | |
| 5,972,734 A | 10/1999 | Carichner et al. | |
| 5,976,912 A | 11/1999 | Fukutomi et al. | |
| 5,977,626 A | 11/1999 | Wang et al. | |
| 5,977,633 A | 11/1999 | Suzuki et al. | |
| 5,982,621 A | 11/1999 | Li | |
| 5,986,340 A | 11/1999 | Mostafazadeh et al. | |
| 5,986,885 A | 11/1999 | Wyland | |
| 5,998,241 A | 12/1999 | Niwa | |
| 5,999,415 A | 12/1999 | Hamzehdoost | |
| 6,002,147 A | 12/1999 | Iovdalsky et al. | |
| 6,002,169 A | 12/1999 | Chia et al. | |
| 6,011,304 A | 1/2000 | Mertol | |
| 6,011,694 A | 1/2000 | Hirakawa | |
| 6,020,637 A | 2/2000 | Karnezos | |
| 6,028,358 A | 2/2000 | Suzuki | |
| 6,034,427 A | 3/2000 | Lan et al. | |
| 6,040,984 A | 3/2000 | Hirakawa | |
| 6,057,601 A | 5/2000 | Lau et al. | |
| 6,060,777 A | 5/2000 | Jamieson et al. | |
| 6,069,407 A | 5/2000 | Hamzehdoost | |
| 6,077,724 A | 6/2000 | Chen | |
| 6,084,297 A | 7/2000 | Brooks et al. | |
| 6,084,777 A | 7/2000 | Kalidas et al. | |
| 6,114,761 A | 9/2000 | Mertol et al. | |
| 6,117,797 A | 9/2000 | Hembree | |
| 6,122,171 A | 9/2000 | Akram et al. | |
| 6,133,064 A | 10/2000 | Nagarajan et al. | |
| 6,140,707 A | 10/2000 | Plepys et al. | |
| 6,160,705 A | 12/2000 | Stearns et al. | |
| 6,162,659 A | 12/2000 | Wu | |
| 6,163,458 A * | 12/2000 | Li | 361/704 |
| 6,166,434 A | 12/2000 | Desai et al. | |
| 6,184,580 B1 | 2/2001 | Lin | |
| 6,201,300 B1 | 3/2001 | Tseng et al. | |
| 6,207,467 B1 | 3/2001 | Vaiyapuri et al. | |
| 6,212,070 B1 | 4/2001 | Atwood et al. | |
| 6,242,279 B1 | 6/2001 | Ho et al. | |
| 6,246,111 B1 | 6/2001 | Huang et al. | |
| 6,278,613 B1 | 8/2001 | Fernandez et al. | |
| 6,288,444 B1 | 9/2001 | Abe et al. | |
| 6,313,521 B1 | 11/2001 | Baba | |
| 6,313,525 B1 | 11/2001 | Sasano | |
| 6,347,037 B2 | 2/2002 | Iijima et al. | |
| 6,362,525 B1 | 3/2002 | Rahim | |
| 6,369,455 B1 | 4/2002 | Ho et al. | |
| 6,380,623 B1 | 4/2002 | Demore | |
| 6,462,274 B1 | 10/2002 | Shim et al. | |
| 6,472,741 B1 | 10/2002 | Chen et al. | |
| 6,525,942 B2 | 2/2003 | Huang et al. | |
| 6,528,869 B1 | 3/2003 | Glenn et al. | |
| 6,528,892 B2 | 3/2003 | Caletka et al. | |
| 6,541,832 B2 | 4/2003 | Coyle | |
| 6,545,351 B1 | 4/2003 | Jamieson et al. | |
| 6,552,266 B2 | 4/2003 | Carden et al. | |
| 6,552,428 B1 | 4/2003 | Huang et al. | |
| 6,552,430 B1 | 4/2003 | Perez et al. | |
| 6,559,536 B1 * | 5/2003 | Katoh et al. | 257/712 |
| 6,563,712 B2 | 5/2003 | Akram et al. | |
| 6,580,167 B1 * | 6/2003 | Glenn et al. | 257/718 |
| 6,583,516 B2 | 6/2003 | Hashimoto | |
| 6,614,660 B1 | 9/2003 | Bai et al. | |
| 6,617,193 B1 | 9/2003 | Toshio et al. | |
| 6,657,870 B1 | 12/2003 | Ali et al. | |
| 6,664,617 B2 | 12/2003 | Siu | |
| 6,667,546 B2 * | 12/2003 | Huang et al. | 257/691 |
| 6,724,071 B2 | 4/2004 | Combs | |
| 6,724,080 B1 | 4/2004 | Ooi et al. | |
| 6,853,070 B2 * | 2/2005 | Khan et al. | 257/707 |
| 6,875,634 B2 * | 4/2005 | Shim et al. | 438/108 |
| 2001/0001505 A1 | 5/2001 | Schueller et al. | |
| 2001/0040279 A1 | 11/2001 | Mess et al. | |
| 2001/0045644 A1 | 11/2001 | Huang | |
| 2002/0053731 A1 | 5/2002 | Chao et al. | |
| 2002/0072214 A1 | 6/2002 | Yuzawa et al. | |
| 2002/0079562 A1 | 6/2002 | Zhao et al. | |
| 2002/0079572 A1 | 6/2002 | Khan et al. | |
| 2002/0096767 A1 | 7/2002 | Cote et al. | |
| 2002/0098617 A1 | 7/2002 | Lee et al. | |
| 2002/0109226 A1 | 8/2002 | Khan et al. | |
| 2002/0135065 A1 | 9/2002 | Zhao et al. | |
| 2002/0171144 A1 | 11/2002 | Zhang et al. | |
| 2002/0180040 A1 | 12/2002 | Camenforte et al. | |
| 2002/0185717 A1 | 12/2002 | Eghan et al. | |
| 2003/0111726 A1 | 6/2003 | Khan et al. | |
| 2003/0138613 A1 | 7/2003 | Thoman et al. | |
| 2004/0072456 A1 | 4/2004 | Dozier, II et al. | |

FOREIGN PATENT DOCUMENTS

| | | |
|---|---|---|
| EP | 0 573 297 A3 | 12/1993 |
| EP | 0 504 411 B1 | 6/1998 |
| FR | 2803098 * | 12/1999 |
| FR | 2 803 098 | 6/2001 |
| JP | 61-49446 | 3/1986 |
| JP | 7-283336 | 10/1995 |

| JP | 10-50877 | 2/1998 |
| JP | 10-189835 | 7/1998 |
| JP | 10-247702 | 9/1998 |
| JP | 10-247703 | 9/1998 |
| JP | 11-17064 | 1/1999 |
| JP | 11-102989 | 4/1999 |
| JP | 2000-286294 | 10/2000 |
| JP | 2001-68512 | 3/2001 |
| TW | 383908 | 3/2000 |
| TW | 417219 | 1/2001 |

OTHER PUBLICATIONS

U.S. Appl. No. 10/284,312, filed Mar. 27, 2003, Zhao et al.
U.S. Appl. No. 10/284,340, Zhao et al.
U.S. Appl. No. 10/201,891, filed Dec. 12, 2002, Zhao et al.
U.S. Appl. No. 10/200,336, filed Dec. 12, 2002, Khan et al.
U.S. Appl. No. 10/197,438, filed Dec. 12, 2002, Zhao et al.
U.S. Appl. No. 10/201,309, filed Dec. 19, 2002, Khan et al.
U.S. Appl. No. 10/201,893, filed Dec. 12, 2002, Zhao et al.
U.S. Appl. No. 10/200,255, filed Dec. 19, 2002, Zhao et al.
U.S. Appl. No. 10/101,751, Zhao et al.
U.S. Appl. No. 10/284,371, filed Aug. 7, 2003, Khan et al.
U.S. Appl. No. 10/284,349, filed Aug. 7, 2003, Khan et al.
U.S. Appl. No. 10/284,166, filed Aug. 7, 2003, Zhao et al.
U.S. Appl. No. 10/284,366, filed Aug. 7, 2003, Zhao et al.
Amkor package data sheet, "SuperFC®", from http://www.amkor.com/Products/all_datasheets/superfc.pdf, 2 pages (Jan. 2003).
Andros, F., "Tape Ball Grid Array," from Puttlitz, K.J. and Totta, P.A. (eds.), *Area Array Interconnection Handbook*, pp. 619-620, ISBN No. 0-7923-7919-5, Kluwer Academic Publishers (2001).
Brofman, P.J. et al., "Flip-Chip Die Attach Technology," Puttlitz, K.J. and Totta, P.A. (eds.), *Area Array Interconnection Handbook*, pp. 315-349, ISBN No. 0-7923-7919-5, Kluwer Academic Publishers (2001).
Freyman, B. and Petrucci, M., "High-Pincount PBGAs," *Advanced Packaging*, pp. 44-46, An IHS Group Publication (May/Jun. 1995).
Ghosal, B. et al., "Ceramic and Plastic Pin Grid Array Technology," Puttlitz, K.J. and Totta, P.A. (eds.), *Area Array Interconnection Handbook*, pp. 551-576, ISBN No. 0-7923-7919-5, Kluwer Academic Publishers (2001).
Harper, C.A. (ed.), *Electronic Packaging And Interconnection Handbook*, Third Edition, pp. 7.58-7.59, ISBN No. 0-07-134745-3, McGraw-Hill Companies (2000).
Lin, S. and Chang, N., "Challenges in Power-Ground Integrity," *Proceedings Of The 2001 International Conference On Computer-Aided Design*, pp. 651-654 (Nov. 4-8, 2001).
Lloyd, J. and Overhauser, D., "Electromigration wreaks havoc in IC design," *EDN*, pp. 145-148 (Mar. 26, 1998).
Song, W.S. and Glasser, L.A., "Power Distribution Techniques for VLSI Circuits," *IEEE Journal Of Solid-State Circuits*, vol. SC-21, No. 1, pp. 150-156 (Feb. 1986).
Tang, K.T. and Friedman, E.G., "Simultaneous Switching Noise in On-Chip CMOS Power Distribution Networks," *IEEE Transactions On Very Large Scale Integration (VLSI) Systems*, vol. 10, No. 4, pp. 487-493 (Aug. 2002).
Zhao, S. et al., U.S. Appl. No. 10/870,927, filed Jun. 21, 2004, entitled "Apparatus and Method for Thermal and Electromagnetic Interference (EMI) Shielding Enhancement in Die-up Array Packages".
Khan, R. et al., U.S. Appl. No. 10/952,172, filed Sep. 29, 2004, entitled "Die Down Ball Grid Array Packages and Method for Making Same".
Written Primary Examination Decision of Rejection issued by the Taiwan Patent Office (with English translation attached) 5 pages.
International Search Report for European Application No. 03006574.2, mailed Mar. 8, 2004, 4 pages.
Ahn, S.H. and Kwon, Y.S., "Popcorn Phenomena in a Ball Grid Array Package", IEEE Transactions on Components, Packaging, and Manufacturing Technology Part B: Advanced Packaging, IEEE, Aug. 1995, vol. 18, No. 3, pp. 491-496.

Amkor Electronics, "Amkor BGA Packaging: Taking The World By Storm", Electronic Packaging & Production, Cahners Publishing Company, May 1994, page unknown.
Anderson, L. and Trabucco, B., "Solder Attachment Analysis of Plastic BGA Modules", Surface Mount International Conference, Surface Mount International, Aug. 28-Sep. 1, 1994, San Jose, California, pp. 189-194.
Andrews, M., "Trends in Ball Grid Array Technology," Ball Grid Array National Symposium, Mar. 29-30, 1995, Dallas, Texas, 10 pages.
Attarwala, A.I. Dr. and Stierman, R., "Failure Mode Analysis of a 540 Pin Plastic Ball Grid Array", Surface Mount International Conference, Surface Mount International, Aug. 28-Sep. 1, 1994, San Jose, California, pp. 252-257.
Banerji, K., Development of the Slightly Larger Than IC Carrier (SLICC), Journal of Surface Mount Technology, Jul. 1994, pp. 21-26.
Bauer, C., Ph.D., "Partitioning and Die Selection Strategies for Cost Effective MCM Designs", Journal of Surface Mount Technology, Oct. 1994, pp. 4-9.
Bernier, W.E. et al., "BGA vs. QFP: A Summary of Tradeoffs for Selection of High I/O Components", Surface Mount International Conference Proceedings, Surface Mount International, Aug. 28-Sep. 1, 1994, San Jose, California, pp. 181-185.
Burgos, J. et al., "Achieving Accurate Thermal Characterization Using a CFD Code—A Case Study of Plastic Packages", IEEE Transactions on Components, Packaging, and Manufacturing Technology Part A, IEEE, Dec. 1995, vol. 18, No. 4, pp. 732-738.
Chadima, M., "Interconnecting Structure Manufacturing Technology," Ball Grid Array National Symposium, Dallas, Texas, Mar. 29-30, 1995.
Chanchani, R. et al., "Mini BGA: Pad and Pitch Ease Die Test and Handling", Advanced Packaging, IHS Publishing Group, May/Jun. 1995, pp. 34, 36-37.
Chung, T.C. et al., "Rework of Plastic, Ceramic, and Tape Ball Grid Array Assemblies", Ball Grid Array National Symposium Proceedings, Dallas, Texas, Mar. 29-30, 1995, pp. 1-15.
Cole, M.S. and Caulfield, T. "A Review of Available Ball Grid Array (BGA) Packages", Journal of Surface Mount Technology, Surface Mount Technology Association, Jan. 1996, vol. 9, pp. 4-11.
Cole, M.S. and Caulfield, T., "Ball Grid Array Packaging", Surface Mount International Conference Proceedings, Surface Mount International, Aug. 28-Sep. 1, 1994, San Jose, California, pp. 147-153.
Dobers, M. and Seyffert, M., "Low Cost MCMs: BGAs Provide a Fine-Pitch Alternative", Advanced Packaging, IHS Publishing Group, Sep./Oct. 1994, vol. 3, No. 5, pp. 28, 30 and 32.
Dody, G. and Burnette, T., "BGA Assembly Process and Rework", Journal of Surface Mount Technology, Surface Mount Technology Association, Jan. 1996, vol. 9, pp. 39-45.
Edwards, D. et al., "The Effect of Internal Package Delaminations on the Thermal Performance of PQFP, Thermally Enhanced PQFP, LOC and BGA Packages", 45th Electronic Components & Technology Conference, IEEE, May 21-24, 1995, Las Vegas, NV, pp. 285-292.
Ejim, T.L. et al., "Designed Experiment to Determine Attachment Reliability Drivers for PBGA Packages", Journal of Surface Mount Technology, Surface Mount Technology Association, Jan. 1996, vol. 9, pp. 30-38.
Ewanich, J. et al., "Development of a Tab (TCP) Ball Grid Array Package", Proceedings of the 1995 International Electronics Packaging Conference, San Diego, CA, Sep. 24-27, 1995, pp. 588-594.
Fauser, S. et al, "High Pin-Count PBGA Assembly", Circuits Assembly, Feb. 1995, vol. 6, No. 2, pp. 36-38 and 40.
Fauser, Suzanne et al., "High Pin Count PBGA Assembly: Solder Defect Failure Modes and Root Cause Analysis", Surface Mount International, Proceedings of The Technical Program, Surface Mount International, Aug. 28-Sep. 1, 1994, San Jose, California, pp. 169-174.
Ferguson, M. "Ensuring High-Yield BGA Assembly", Circuits Assembly, Feb. 1995, vol. 6, No. 2, pp. 54, 56 and 58.
Freda, M., "Laminate Technology for IC Packaging", Electronic Packaging & Production, Cahners Publishing Company, Oct. 1995, vol. 35, No. 11, pp. S4-S5.

Freedman, M., "Package Size and Pin-Out Standardization", Ball Grid Array National Symposium, Mar. 29-30, 1995, 7 pages.

Freyman, B. and Pennisi, R., "Over-molded Plastic Pad Arrary Carriers (OMPAC): A Low Cost, High Interconnect Density IC Packaging Solution for Consumer and Industrial Electronics", 41st Electronic Compounds & Technology Conference, IEEE, May 11-16, 1991, pp. 176-182.

Freyman, B. et al., "Surface Mount Process Technology for Ball Grid Array Packaging", Surface Mount International Conference Proceedings, Surface Mount International, Aug. 29-Sep. 2, 1993, San Jose, California, pp. 81-85.

Freyman, B. et al., "The Move to Perimeter Plastic BGAs", Surface Mount International Conference Proceedings, San Jose, CA, Aug. 29-31, 1995, pp. 373-382.

Freyman, B., "Trends in Plastic BGA Packaging," Ball Grid Array National Symposium, Dallas, Texas, Mar. 29-30, 1995, 45 pages.

Gilleo, K., "Electronic Polymers: Die Attach and Oriented Z-Axis Films", Advanced Packaging, IHS Publishing Group, Sep./Oct. 1994, vol. 3, No. 5, pp. 37-38, 40 and 42.

Guenin, B. et al., "Analysis of a Thermally Enhanced Ball Grid Array Package", IEEE Transactions on Components, Packaging, and Manufacturing Technology, Part A, IEEE Components, Packaging, and Manufacturing Technology Society, Dec. 1995, vol. 18, No. 4, pp. 749-757.

Hart, C., "Vias in Pads for Coarse and Fine Pitch Ball Grid Arrays", Surface Mount International Conference Proceedings, Surface Mount International, Aug. 28-Sep. 1, 1994, San Jose, California, pp. 203-207.

Hart, C. "Vias in Pads", Circuits Assembly, Feb. 1995, vol. 6, No. 2, pp. 42, 44-46 and 50.

Hattas, D., "BGAs Face Production Testing: New Package Offers Promise but Must Clear Technology Hurdles.", Advanced Packaging, IHS Publishing Group, Summer 1993, vol. 2, No. 3, pp. 44-46.

Schueller, R.D. et al., "Performance and Reliability of a Cavity Down Tape BGA Package," *IEEE Electronic Packaging Technology Conference*, 1997, pp. 151-162.

Hodson, T., "Study Examines BGA Use", Electronic Packaging & Production, Mar. 1993, page unknown.

Holden, H., "The Many Techniques of Small Via Formation for Thin Boards", The Institute for Interconnecting and Packaging Electronic Circuits Ball Grid Array National Symposium, San Diego, CA, Jan. 18-19, 1996, pp. 1-7.

Houghten, J., "New Package Takes On QFPs", Advanced Packaging, IHS Publishing Group, Winter 1993, vol. 2, No. 1, pp. 38-39.

"How To Give Your BGAs A Better Bottom Line.", Advanced Packaging, IHS Publishing Group, Jan./Feb. 1995, page unknown.

Huang, W. and Ricks, J., "Electrical Characterization of PBGA for Communication Applications by Simulation and Measurement", National Electronic Packaging and Production Conference West '95, Feb. 26- Mar. 2, 1995, Anaheim, California, pp. 300-307.

Hundt, M. et al., "Thermal Enhancements of Ball Grid Arrays", National Electronic Packaging and Production Conference West '95, Reed Exhibition Companies, Anaheim, CA, Feb. 25-29, 1996, pp. 702-711.

Hutchins, C.L., "Understanding Grid Array Packages", Surface Mount Technology Magazine, IHS Publishing Group, Nov. 1994, vol. 8, No. 11, pp. 12-13.

Hwang, J.S., "Reliability of BGA Solder Interconnections", Surface Mount Technology Magazine, IHS Publishing Group, Sep. 1994, vol. 8, No. 9, pp. 14-15.

Hwang, J.S., "A Hybrid of QFP and BGA Architectures", Surface Mount Technology Magazine, IHS Publishing Group, Feb. 1995, vol. 9, No. 2, p. 18.

Johnson, R. et al., "A Feasibility Study of of Ball Grid Array Packaging", National Electronic Packaging and Production Conference East '93, Boston, Massachusetts, Jun. 14-17, 1993, pp. 413-422.

Johnson, R. et al., "Thermal Characterization of 140 and 225 Pin Ball Grid Array Packages", National Electronic Packaging & Production Conference East '93, Boston, Massachusetts, Jun. 14-17, 1993, pp. 423-430.

Johnston, P., "Land Pattern Interconnectivity Schemes", Ball Grid Array National Symposium, Dallas, Texas, Mar. 29-30, 1995, pp. 2-21.

Johnston, P. "Printed Circuit Board Design Guidelines for Ball Grid Array Packages", Journal of Surface Mount Technology, Surface Mount Technology Association, Jan. 1996, vol. 9, pp. 12-18.

Kawahara, T. et al., "Ball Grid Array Type Package By Using of New Encapsulation Method", Proceedings of the 1995 International Electronics Packaging Conference, San Diego, CA, Sep. 24-27, 1995, pp. 577-587.

Knickerbocker, J.U. and Cole, M.S., "Ceramic BGA: A Packaging Alternative", Advanced Packaging, IHS Publishing Group, Jan./Feb. 1995, vol. 4, No. 1, pp. 20, 22 and 25.

Kromann, G., et al., "A Hi-Density C4/CBGA Interconnect Technology for a CMOS Microprocessor", National Electronic Packaging and Production Conference West '95, IEEE, Feb. 26-Mar. 2, 1995 Anaheim, California, pp. 1523-1529.

Kunkle, R., "Discrete Wiring for Array Packages", Ball Grid Array National Symposium, Dallas, Texas, Mar. 29-30, 1995, 9 pages.

Lall, B. et al, "Methodology for Thermal Evaluation of Multichip Modules", IEEE Transactions on Components, Packaging, and Manufacturing Technology Part A, IEEE, Dec. 1995, vol. 18, No. 4, pp. 758-764.

Lasance, C. et al., "Thermal Characterization of Electronic Devices with Boundary Condition Independent Compact Models", IEEE Transactions on Components, Packaging, and Manufacturing Technology Part A, IEEE Components, Packaging, and Manufacturing Technology Society, Dec. 1995, vol. 18, No. 4, pp. 723-731.

Lau, J., "Ball Grid Array Technology", McGraw-Hill Inc., 1995, entire book submitted.

Lau, J. et al., "No Clean Mass Reflow of Large Plastic Ball Grid Array Packages", Circuit World, Wela Publications Ltd., vol. 20, No. 3, Mar. 1994, pp. 15-22.

"Literature Review", Special Supplement to Electronic Packaging & Production, Feb. 1995, Cahners Publication, 10 pages.

LSI Logic Package Selector Guide, Second Edition, LSI Logic Corporation, 1994-1995, entire document submitted.

"LTCC MCMs Lead to Ceramic BGAs," Advanced Packaging, IHS Publishing Group, Sep./Oct. 1994, vol. 3, No. 5, pp. 14-15.

Mak, Dr. W.C. et al., "Increased SOIC Power Dissipation Capability Through Board Design and Finite Element Modeling", Journal of Surface Mount Technology, Surface Mount International, Oct. 1994, pp. 33-41.

Marrs, R.C. and Olachea, G., "BGAs For MCMs: Changing Markets and Product Functionality", Advanced Packaging, IHS Publishing Group, Sep./Oct. 1994, vol. 3, No. 5, pp. 48, 50, and 52.

Matthew, L.C. et al., "Area Array Packaging: KGD in a Chip-Sized Package", Advanced Packaging, IHS Publishing Group, Jul./Aug. 1994, pp. 91-94.

Mawer, A. et al., "Plastic BGA Solder Joint Reliability Considerations", Surface Mount International Conference Proceedings, Surface Mount International, Aug. 28-Sep. 1, 1994, San Jose, California, pp. 239-251.

Mazzullo, T. and Schaertl, L., "How IC Packages Affect PCB Design", Surface Mount Technology Magazine, Feb. 1995, vol. 9, No. 2, pp. 114-116.

Mearig, J., "An Overview of Manufacturing BGA Technology", National Electronic Packaging and Production Conference West '95, Feb. 26-Mar. 2, 1995, Anaheim, California, pp. 295-299.

Mertol, A., "Application of the Taguchi Method on the Robust Design of Molded 225 Plastic Ball Grid Array Packages", IEEE Transactions on Components, Packaging, and Manufacturing Technology Part B: Advanced Packaging, IEEE, Nov. 1995, vol. 18, No. 4, pp. 734-743.

Mescher, P. and Phelan, G., "A Practical Comparison of Surface Mount Assembly for Ball Grid Array Components", Surface Mount International Conference Proceedings, Surface Mount International, Aug. 28-Sep. 1, 1994, San Jose, California, pp. 164-168.

Mulgaonker, S. et al., "An Assessment of the Thermal Performance of the PBGA Family", Eleventh Annual IEEE Semiconductor Thermal Measurement and Management Symposium, IEEE, San Jose, CA, Feb. 7-9, 1995,pp. 17-27.

"New PBGA Pushes Technology to Outer Limits", Advanced Packaging, IHS Publishing Group, Jan./Feb. 1995, p. 11.

Olachea, G., "Managing Heat: A Focus on Power IC Packaging", Electronic Packaging & Production (Special Supplement), Cahners Publishing Company, Nov. 1994, pp. 26-28.

"Pad Array Improves Density", Electronic Packaging & Production, Cahners Publishing Company, May 1992, pp. 25-26.

Partridge, J. and Viswanadham, P., "Organic Carrier Requirements for Flip Chip Assemblies", Journal of Surface Mount Technology, Surface Mount Technology Association, Jul. 1994, pp. 15-20.

Ramirez, C. and Fauser, S., "Fatigue Life Comparison of The Perimeter and Full Plastic Ball Grid Array", Surface Mount International Conference Proceedings, Surface Mount International, Aug. 28-Sep. 1, 1994, San Jose, California, pp. 258-266.

Rogren, P., "MCM-L Built on Ball Grid Array Formats", National Electronic Packaging and Production Conference West '94, Anaheim, California, pp. 1277-1282.

Rooks, S., "X-Ray Inspection of Flip Chip Attach Using Digital Tomosynthesis", Surface Mount International, Proceedings of The Technical Program, Aug. 28-Sep. 1, 1994, San Jose, California, pp. 195-202.

Rukavina, J., "Attachment Methodologies: Ball Grid Array Technology", Ball Grid Array National Symposium, Dallas, Texas, Mar. 29-30, 1995, 37 pages.

Sack, T., "Inspection Technology", Ball Grid Array National Symposium, Dallas, Texas, Mar. 29-30, 1995, pp. 1-41.

Sakaguchi, H., "BGA Mounting Technology," pp. 1-4, date and source unknown.

Schmolze, C. and Fraser, A., "SPICE Modeling Helps Enhance BGA Performance", Electronic Packaging & Production, Jan. 1995, pp. 50-52.

Semiconductor Group Package Outlines Reference Guide, Texas Instruments, 1995, entire document submitted.

Shimizu, J., "Plastic Ball Grid Array Coplanrity", Surface Mount International Conference, San Jose, California, Aug. 31-Sep. 2, 1993, pp. 86-91.

Sigliano, R., "Using BGA Packages: An Appealing Technology in a QFP and Fine-Pitch Market", Advanced Packaging, IHS Publishing Group, Mar./Apr. 1994, pp. 36-39.

Sirois, L., "Dispensing for BGA: Automated Liquid Dispensing in a High-Density Environment", Advanced Packaging, IHS Publishing Group, May/Jun. 1995, pp. 38 and 41.

Solberg, V., "Interconnection Structure Preparation: Impact of Material Handling and PCB Surface Finish on SMT Assembly Process Yield", Ball Grid Array National Symposium, Dallas Texas, Mar. 29-30, 1995, 10 pages.

"Survival of the Fittest", Advanced Packaging, IHS Publishing Group, Mar./Apr. 1995, page unknown.

Tuck, J., "BGA Technology Branches Out", Circuits Assembly, Feb. 1995, vol. 6, No. 2, pp. 24, 26, and 28.

"Tutorial and Short Courses", 45th Electronic Components & Technology Conference, May 21-24, 1995, Las Vegas, Nevada, IEEE, 6 pages.

Vardaman, E. J. and Crowley, R.T., "Worldwide Trends In Ball Grid Array Developments", National Electronic Packaging and Production Conference West '96, Reed Exhibition Companies, Anaheim, CA, Feb. 25-29, 1996, pp. 699-701.

Walshak, D. and Hashemi, H., "Thermal Modeling of a Multichip BGA Package", National Electronic Packaging and Production Conference West '94, Reed Exhibition Companies, Anaheim, California, Feb. 27-Mar. 4, 1994, pp. 1266-1276.

Walshak, D. and Hashemi, H., "BGA Technology: Current and Future Direction for Plastic, Ceramic and Tape BGAs", Surface Mount International Conference Proceedings, Surface Mount International, Aug. 28-Sep. 1, 1994, San Jose, California, pp. 157-163.

Xie, H. et al., "Thermal Solutions to Pentium Processors in TCP in Notebooks and Sub-Notebooks", 45th Electronic Components & Technology Conference, IEEE, Las Vegas, NV, May 21-24, 1995, pp. 201-210.

Yip, W.Y., "Package Characterization of a 313 Pin BGA", National Electronic Packaging and Production Conference West '95, Reed Exhibition Companies, Feb. 26-Mar. 2, 1995, Anaheim, California, pp. 1530-1541.

Zamborsky, E., "BGAS in the Assembly Process", Circuits Assembly, Feb. 1995, vol. 6, No. 2, pp. 60, 62-64.

Zimerman, M., "High Performance BGA Molded Packages for MCM Application", Surface Mount International Conference Proceedings, Surface Mount International, Aug. 28-Sep. 1, 1994, San Jose, California, pp. 175-180.

Zweig, G., "BGAs: Inspect the Process, Not the Product", Electronic Packaging & Production (Special Supplement), Cahners Publishing Company, Aug. 1994 (Supplement), p. 41.

Houghten, J.L., "Plastic Ball-Grid Arrays Continue To Evolve", Electronic Design, Feb. 6, 1995, pp. 141-146.

Marrs, R. et al., "Recent Technology Breakthroughs Achieved with the New *Super*BGA® Package", 1995 International Electronics Packaging Conference, San Diego, California, Sep. 24-27, 1995, pp. 565-576.

Hayden, T.F. et al., "Thermal & Electrical Performance and Reliability Results for Cavity-Up Enhanced BGAs", Electronic Components and Technology Conference, IEEE,1999, pp. 638-644.

Thompson, T., "Reliability Assessment of a Thin (Flex) BGA Using a Polyimide Tape Substrate", International Electronics Manufacturing Technology Symposium, IEEE, 1999, pp. 207-213.

English-language Abstract of JP 10-189835, published Jul. 21, 1998, 2 pages (last visited Mar. 14, 2003).

English-language Abstract of JP 10-247703, published Sep. 14, 1998, 1 page.

English-language Abstract of JP 2000-286294, published Oct. 13, 2000, 2 pages (last visited Mar. 14, 2003).

English-language Abstract of JP 2001-68512, published Mar. 16, 2001, 1 page (last visited Oct. 2, 2002).

English-language Abstract of JP 10-247702, published Sep. 14, 1998, 2 pages (last visited Jan. 25, 2002).

English-language Abstract of JP 10-50877, published Feb. 20, 1998, 1 page (last visited Oct. 2, 2002).

English-language Abstract of JP 11-17064, published Jan. 22, 1999, 1 page.

English-language Abstract of JP 11-102989, published Apr. 13, 1999, 1 page.

English-language Abstract of JP 7-283336, published Oct. 27, 1995, 1 page.

English-language Abstract of JP 61-49446, published Mar. 11, 1986, 1 page.

Karnezos, M., "An EPBGA Alternative," *Advanced Packaging*, Jun. 1998, pp. 90, 92, 94, and 96.

Zhao, Z., Ph.D., "Thermal Design and Modeling of Packages," *IEEE Short Courses*, Broadcom Corporation, Oct. 25, 2000, 95 pages.

Zhao, Z., Ph.D., "IC Package Thermal Issues and Thermal Design," ASAT, Inc., Jan. 15, 2000, 98 pages, presented at $2^{nd}$ International Icepak User's Group Meeting, Palo Alto, CA, on Feb. 7, 2000.

Heitmann, R., "A Direct Attach Evolution: TAB, COB and Flip Chip Assembly Challenges", Advanced Packaging, IHS Publishing Group, Jul./Aug. 1994, vol. 3, No. 4, pp. 95-99 and 103.

\* cited by examiner stiffener temperature distribution

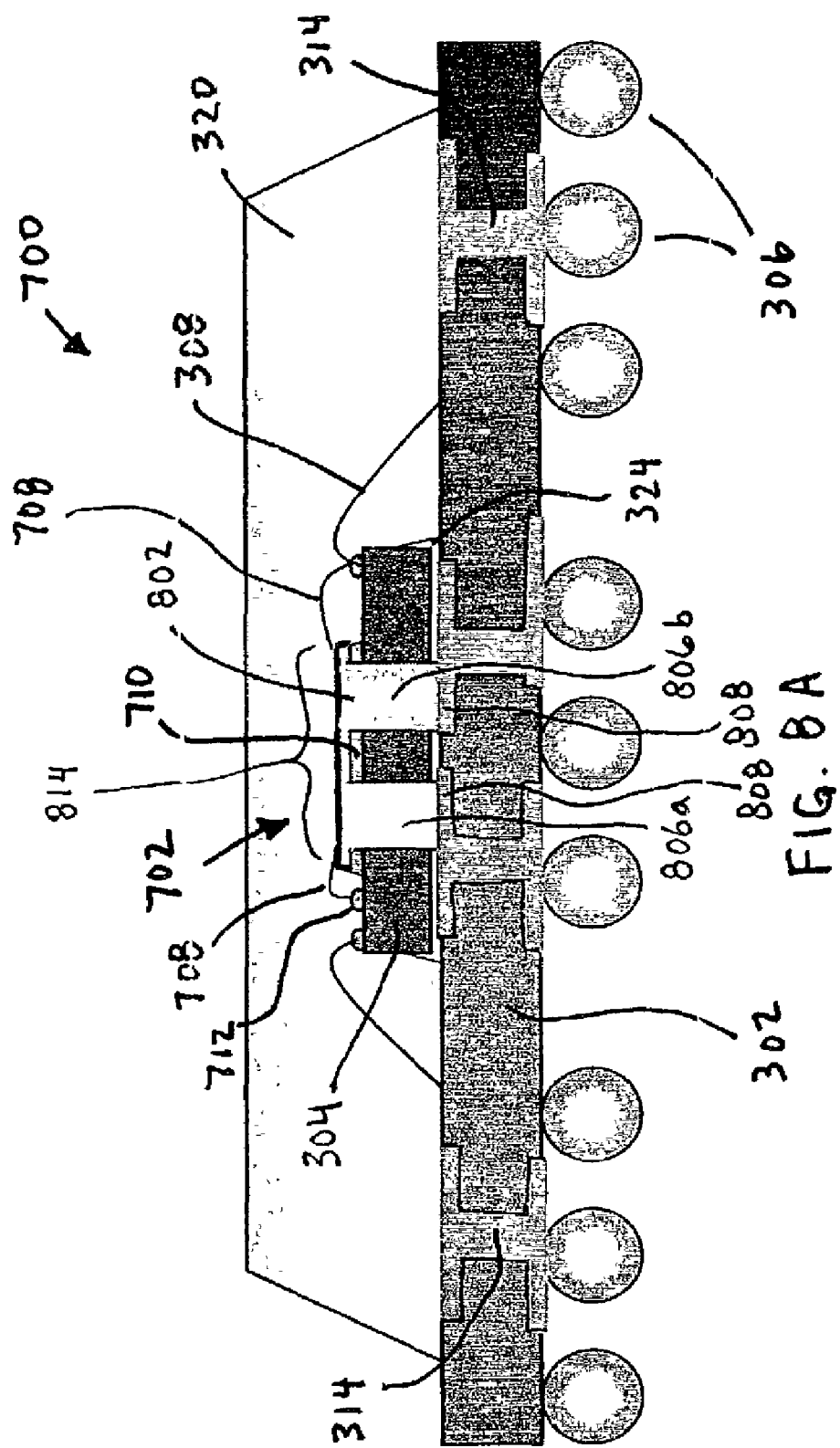

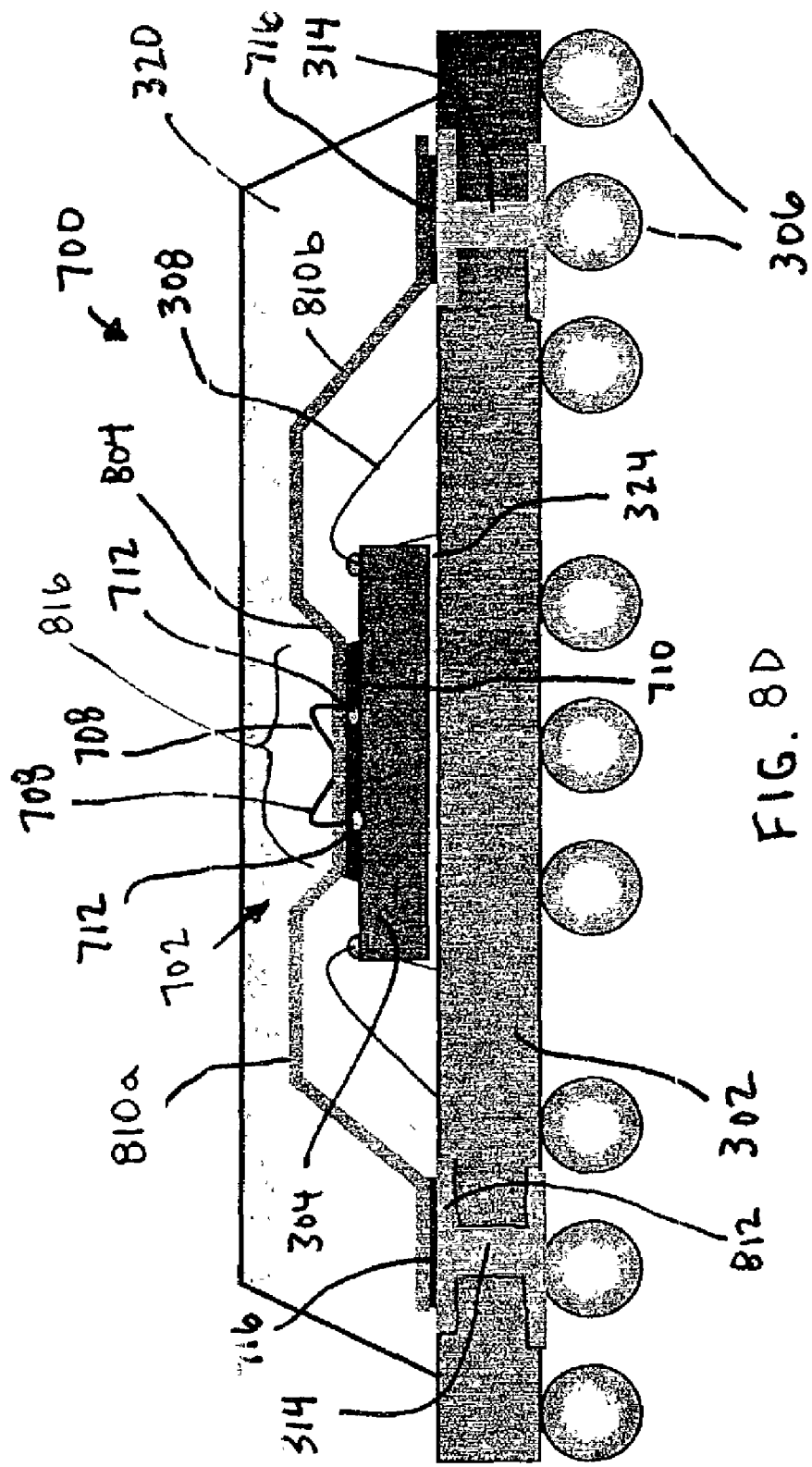

LOW VOLTAGE DROP AND HIGH THERMAL PERFORMANCE BALL GRID ARRAY PACKAGE

CROSS-REFERENCE TO RELATED APPLICATIONS

This application claims the benefit of U.S. Provisional Application No. 60/366,241, filed Mar. 22, 2002.

BACKGROUND OF THE INVENTION

1. Field of the Invention

The invention relates generally to the field of integrated circuit (IC) device packaging technology and, more particularly, to techniques for improving electrical and thermal performances of ball grid array (BGA) packages.

2. Background Art

Integrated circuit (IC) dies are typically mounted in or on a package that is attached to a printed circuit board (PCB). One such type of IC die package is a ball grid array (BGA) package. BGA packages provide for smaller footprints than many other package solutions available today. A BGA package has an array of solder balls located on a bottom external surface of a package substrate. The solder balls are reflowed to attach the package to the PCB. The IC die is mounted to a top surface of the package substrate. Wire bonds typically couple signals in the IC die to the substrate. The substrate has internal routing which electrically couples the IC die signals to the solder balls on the bottom substrate surface.

A number of BGA package substrate types exist, including ceramic, plastic, and tape (also known as "flex"). In some BGA package types, a stiffener may be attached to the substrate to supply planarity and rigidity to the package. In such packages, the IC die may be mounted to the stiffener instead of the substrate. Openings in the stiffener may be used to allow the IC die to be wire-bonded to the substrate.

Die-up and die-down BGA package configurations exist. In die-up BGA packages, the IC die is mounted on a top surface of the substrate or stiffener, opposite of the side to which the solder balls are attached. In die-down BGA packages, the IC die is mounted on a bottom surface of the substrate or stiffener, on the same side as which the solder balls are attached.

Existing BGA packages are subject to high thermal stresses that result from the heat given off during operation of the mounted IC die. The thermal stresses are primarily imposed on the IC die and solder balls due to the mismatch of the thermal expansion coefficient (CTE) between the semiconductor die and the metal stiffener. As a result, conventional flex BGA packages have difficulty in meeting reliability requirements for die sizes larger than about 9 mm. See, e.g., Thompson, T., et al., *Reliability Assessment of a Thin (Flex) BGA Using a Polyimide Tape Substrate*, International Electronics Manufacturing Technology Symposium, IEEE, pp. 207–213 (1999).

The tape substrate used in flex BGA packages is typically polyimide, which has a low value of thermal conductivity. Consequently, the IC die is separated from the PCB internally by the tape substrate which acts as a thermal barrier. The lack of direct thermal connection from IC die to PCB leads to relatively high resistance to heat transfer from IC die-to-board (theta-jb).

A stiffener attached to a substrate can enhance heat spreading. However, the openings on the stiffener for wire bond connections tend to reduce the thermal connections between the IC die and the edges of the stiffener. As a result, heat spreading is limited largely to the region of the IC die attach pad, while areas at the stiffener periphery do not contribute effectively to heat spreading.

Furthermore, because of the high density of the substrate routing circuitry, it is difficult to bond each power and ground pad on the IC die to the substrate by a corresponding bond finger. As a result, the distribution of ground and power signals connecting to the IC die is frequently compromised in conventional BGA packages.

Ball grid array packages that use plastic substrates (for example, BT or FR4 plastic) are commonly known as plastic BGAs, or PBGAs. See, e.g., Lau, J. H., *Ball Grid Array Technology*, McGraw-Hill, N.Y., (1995). A PBGA package, for example, may add solder balls to the bottom substrate surface under the IC die to aid in conducting heat to the PCB. Solder balls such as these are referred to as thermal balls. The cost of the PBGA package, however, will increase with the number of thermal balls. Furthermore, a large array of thermal balls may be necessary for heat dissipation into the PCB for high levels of IC device power.

BGA packages are widely used in the IC packaging industry. This is because BGA packages have many beneficial characteristics, including high reliability, a relatively mature assembly process, relatively low cost, and good thermal and electrical performances.

Existing BGA packages have limitations that affect their ability to be used for advanced IC die applications. As more functions are integrated into individual IC dies, IC dies increasingly have more stringent design requirements, including: (1) handling an increased IC die power requirement; (2) handling an increased number of IC die I/O signals; (3) handling lower voltage values for IC die power supplies; (4) handling higher clock and data transfer signal frequencies; and (5) supporting a decreased IC die size. Existing BGA package designs may use narrower trace widths, longer wire bonds, staggered bond pad arrangements, and larger BGA package sizes to meet these requirements. These design techniques, however, have limitations. For example, these design techniques may lead to unwanted BGA package voltage dropping, which can cause poor performance for the packaged IC die.

Hence, what is needed are BGA packages that have reduced amounts of voltage drop, and that maintain high levels of thermal performance.

BRIEF SUMMARY OF THE INVENTION

The present invention provides for improved thermal conduction from an IC die and for reduced package inductance and voltage drop. In embodiments of the present invention, a heat sink assembly is coupled in an integrated circuit package. The package may be a land grid array (LGA), pin grid array (PGA), chip scale package (CSP), ball grid array (BGA), quad flat pack (QFP), and other integrated circuit package type. The heat sink assembly provides an enhanced thermal and electrical connection from the IC die to the package substrate.

In an aspect of the present invention, a low voltage drop and thermally enhanced integrated circuit package is described. A substantially planar substrate having a plurality of contact pads on a first surface is electrically connected through the substrate to a plurality of solder ball pads on a second surface of the substrate. An IC die having a first surface is mounted to the first surface of the substrate. The IC die has a plurality of I/O pads electrically connected to the plurality of contact pads on the first surface of the substrate. A heat sink assembly is coupled to a second surface of the IC die and to a first contact pad on the first surface of the substrate to provide a thermal path from the IC die to the first surface of the substrate. The heat sink assembly may have one or two heat sink elements to provide thermal and/or electrical connectivity between the IC die and the substrate.

In a further aspect, the heat sink assembly provides an electrically conductive path from a first I/O pad of the IC die to the first contact pad.

In a further aspect, a first and a second heat sink element are present in the heat sink assembly. A first surface of the first heat sink element is attached to the IC die. The second heat sink element is coupled to a second surface of the first heat sink element and to a contact pad on the substrate.

In a still further aspect, the second surface of the first heat sink element has a bond area and a contact area. The bond area is electrically coupled to the contact area. A wire bond couples an I/O bond pad on the second surface of the IC die to the bond area. The second heat sink element is electrically coupled to the contact area.

In a still further aspect, the heat sink assembly is segmented. The second surface of the first heat sink element further has a second bond area and a second contact area. The second bond area is electrically coupled to the second contact area. The first contact area is electrically isolated from the second contact area. The second heat sink element includes a first arm portion and a second arm portion. The first arm portion is attached to the first contact area and the first contact pad on the first surface of the substrate. The second arm portion is attached to the second contact area and a second contact pad on the first surface of the substrate. A second wire bond electrically couples a second I/O bond pad on the second surface of the IC die to the second bond area. The first I/O bond pad is coupled to a first signal in the IC die, and the second I/O bond pad is coupled to a second signal in the IC die.

In another aspect, the second surface of the first heat sink element has a plurality of bond areas and a plurality of contact areas. Each bond area of the plurality of bond areas is electrically coupled to a contact area of the plurality of contact areas. The plurality of contact areas are electrically isolated from each other. The second heat sink element has a plurality of portions that are each electrically coupled to a respective contact area of the plurality of contact areas.

In another aspect, the second heat sink element includes at least one perforation that opens from a first surface of the second heat sink element to the second surface of a second heat sink element.

In a further aspect, a thermally and/or electrically conductive adhesive material substantially fills the at least one perforation and attaches the first surface of the second heat sink element to the second surface of the first heat sink element.

In another aspect, an encapsulate material encapsulates the IC die and the at least a portion of the heat sink assembly on the first surface of the substrate.

In yet another aspect, the heat sink assembly includes a single heat sink element. The single heat sink element is coupled to the second surface of the IC die and to the first contact pad on the first surface of the substrate. The single heat sink element has the features and aspects of the first and second heat sink elements of the two-heat sink element configuration.

Through the use of the heat sink assembly, one or more important signals of the IC die are coupled to one or more package solder balls by a lower inductance path than conventional paths that include lengthy wire bonds. The relatively shorter inner wire bond(s) and heat sink assembly form an electrical connection path that can be used for a ground, power or other critical signal.

The heat sink assembly may be electrically segmented or divided to support a plurality of ground, power, and critical signals. For example, in single heat sink element configurations, the single heat sink element may be segmented. In a two heat sink element configuration, the first heat sink element and second heat sink element may be electrically segmented or divided.

In aspects of the present invention, the heat sink assembly provides for an improved thermal conduction path from the IC die. Heat from the IC die may be better conducted to the package substrate by the heat sink assembly, and better radiated to the environment by the heat sink assembly. In a first aspect, a thermal path is formed from the IC die, through the first heat sink element and second heat sink element, to the package substrate. In a second aspect, a thermal path is formed from the IC die, through the single heat sink element, to the package substrate.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 8A shows a cross-sectional view of an example BGA package with an example heat sink assembly, according to an embodiment of the present invention.

FIG. 8D shows a cross-sectional view of an example BGA package with an example heat sink assembly, according to an embodiment of the present invention.

FIG. 9A shows a cross-sectional view of an example BGA package with an example perforated heat sink assembly, according to an embodiment of the present invention.

Figure 1A:
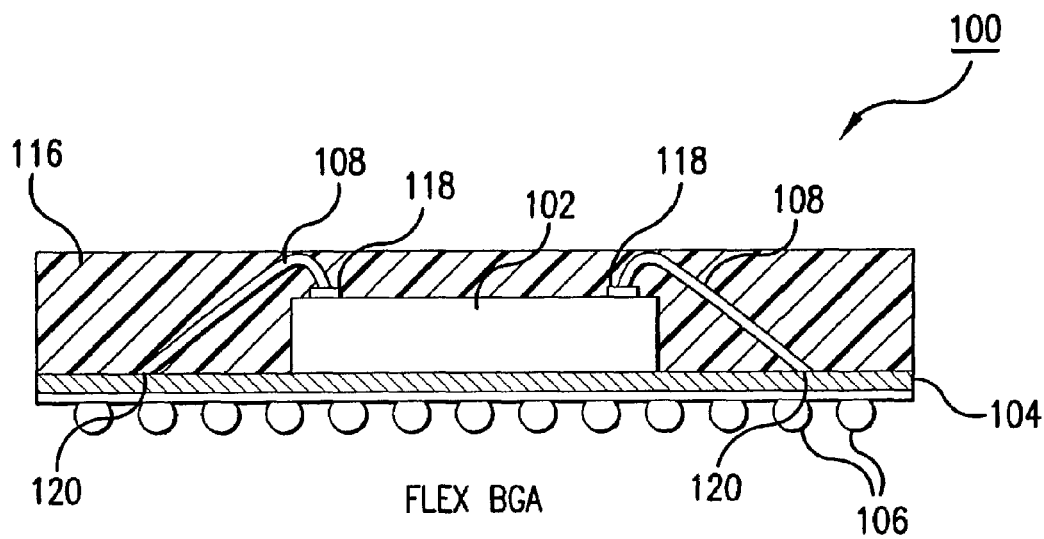
FIGS. 1A and 1B illustrate conventional flex BGA packages.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Overview

The present invention is directed to a method, system, and apparatus for improving the mechanical, thermal, and electrical performances of integrated circuit packages. For example, the present invention is applicable in land grid array (LGA), pin grid array (PGA), chip scale package (CSP), ball grid array (BGA), quad flat pack (QFP), and other integrated circuit package types. The present invention is applicable to all types of package substrates, including ceramic, plastic, and tape (flex) substrates. Furthermore the present invention is applicable to die-up (cavity-up) and die-down (cavity-down) IC die orientations. For illustrative purposes, the present invention is described herein as being implemented in a BGA package. However, the present invention is applicable to the other integrated circuit package types mentioned herein, and to additional integrated circuit package types.

Ball grid array package types are described below. A discussion of package inductances and resistances is then provided. Various embodiments of the present invention are also presented below. The embodiments described herein may be combined in any applicable manner, as required by a particular application.

Ball Grid Array (BGA) Package

A ball grid array (BGA) package is used to package and interface an IC die with a printed circuit board (PCB). BGA packages may be used with any type of IC die, and are particularly useful for high speed ICs. In a BGA package, solder pads do not just surround the package periphery, as in chip carrier type packages, but cover the entire bottom package surface in an array configuration. BGA packages are also referred to as pad array carrier (PAC), pad array, land grid array, and pad-grid array packages. BGA package types are further described in the following paragraphs. For additional description on BGA packages, refer to Lau, J. H., *Ball Grid Array Technology*, McGraw-Hill, N.Y., (1995), which is herein incorporated by reference in its entirety.

Die-up and die-down BGA package configurations exist. In die-up BGA packages, the IC die is mounted on a top surface of the substrate or stiffener, in a direction away from the PCB. In die-down BGA packages, the IC die is mounted on a bottom surface of the substrate or stiffener, in a direction towards the PCB.

A number of BGA package substrate types exist, including ceramic, plastic (PBGA), and tape (also known as "flex"). FIG. 1A illustrates a conventional flex BGA package 100. Flex BGA package 100 includes an IC die 102, a tape substrate 104, a plurality of solder balls 106, and one or more wire bonds 108. Tape or flex BGA packages are particularly appropriate for large IC dies with large numbers of input and outputs, such as application specific integrated circuits (ASIC) and microprocessors.

Tape substrate 104 is generally made from one or more conductive layers bonded with a dielectric material. For instance, the dielectric material may be made from various substances, such as polyimide tape. The conductive layers are typically made from a metal, or combination of metals, such as copper and/or aluminum. Trace or routing patterns are made in the conductive layer material. Substrate 104 may be a single-layer tape, a two-layer tape, or additional layer tape substrate type. In a two-layer tape, the metal layers sandwich the dielectric layer, such as in a copper-Upilex-copper arrangement.

IC die 102 is attached directly to substrate 104, for example, by an epoxy or other die-attach material. IC die 102 is any type of semiconductor integrated circuit, separated from a semiconductor wafer.

One or more wire bonds 108 connect corresponding bond pads 1118 on IC die 102 to contact pads 120 on substrate 104. Bond pads 118 are I/O pads for IC die 102 that make internal signals of IC die 102 externally available.

Encapsulating material 116 covers IC die 102 and wire bonds 108 for mechanical and environmental protection. Encapsulating material 116 is a mold compound, epoxy, or other applicable encapsulating substance.

Figure 1B:
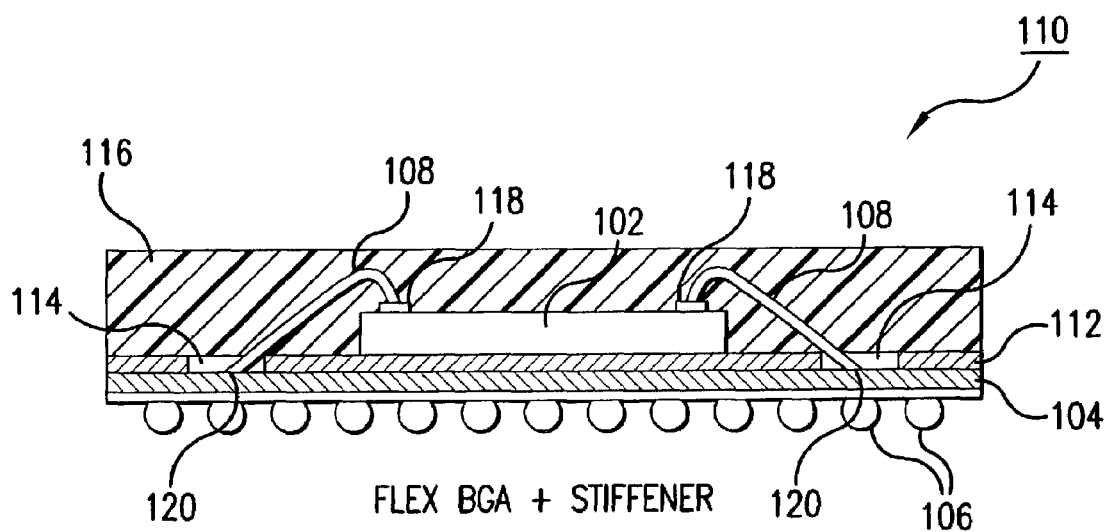

As shown in FIG. 1A, flex BGA package 100 does not include a stiffener. In some BGA package types, particularly in flex BGA packages, a stiffener can be attached to the substrate to add planarity and rigidity to the package. FIG. 1B illustrates a flex BGA package 110, similar to flex BGA package 100, that incorporates a stiffener 112. Stiffener 112 may be laminated to substrate 104. Stiffener 112 is typically made from a metal, or combination of metals, such as copper, tin, and/or aluminum, or may be made from a polymer, for example. Stiffener 112 also may act as a heat sink, and allow for greater heat spreading in BGA package 110. One or more openings 114 in stiffener 112 may be used to allow for wire bonds 108 to connect IC die 102 to substrate 104. Stiffener 112 may be configured in other ways, and have different opening arrangements than shown in FIG. 1B.

Figure 2A:
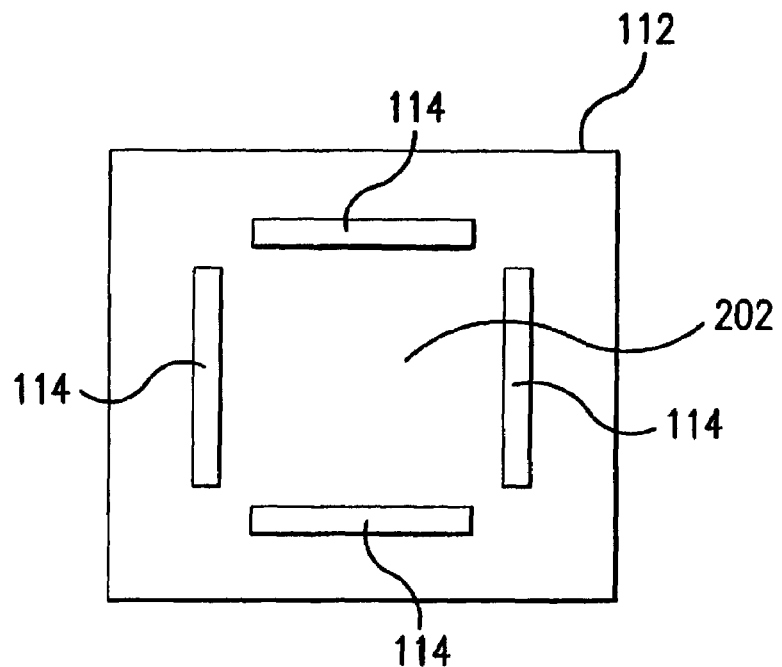
FIG. 2A shows a top view of a stiffener.
Figure 2B:
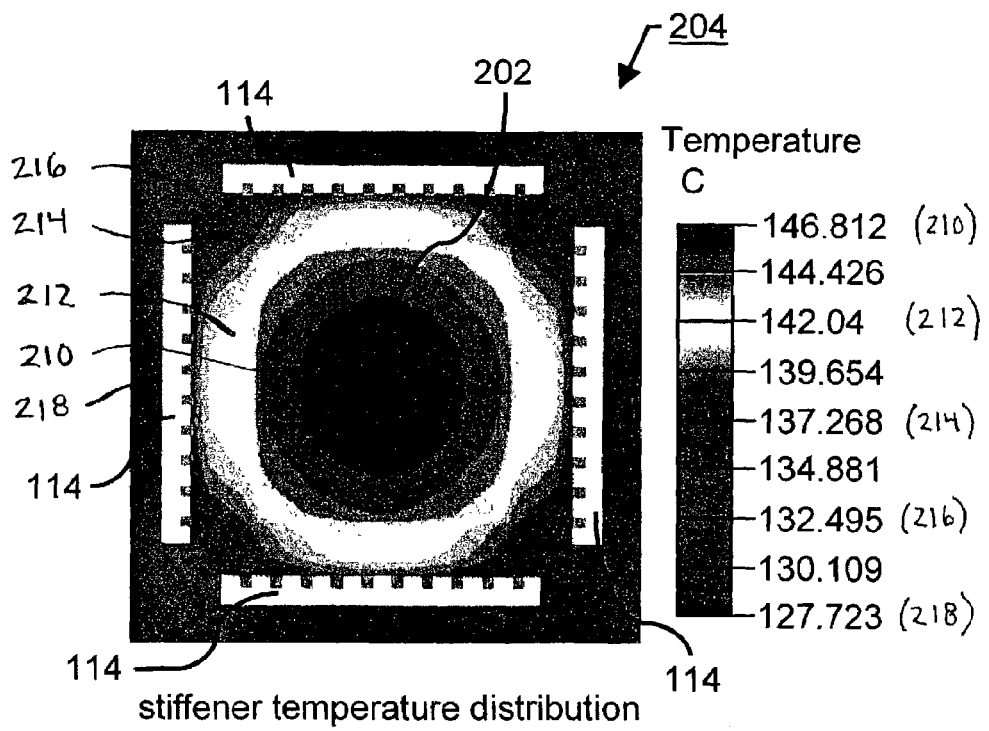
FIG. 2B shows a temperature distribution for a stiffener during operation of an IC device in a flex BGA package.

The use of a stiffener in a flex BGA package requires additional considerations when attempting to manage heat spreading. FIG. 2A shows a top view of a stiffener 112. Stiffener 112 includes an opening 114 adjacent to all four sides of an IC die mounting position 202 in the center of stiffener 112. FIG. 2B shows a temperature distribution 204 of a stiffener, such as stiffener 112, during operation of an IC die in a flex BGA package. Temperature distribution 204 shows that heat transfer from IC die mounting position 202 to the edges of stiffener 112 is substantially limited by openings 114. Openings 114 act as thermal barriers to heat spreading in stiffener 112.

Figure 2C:
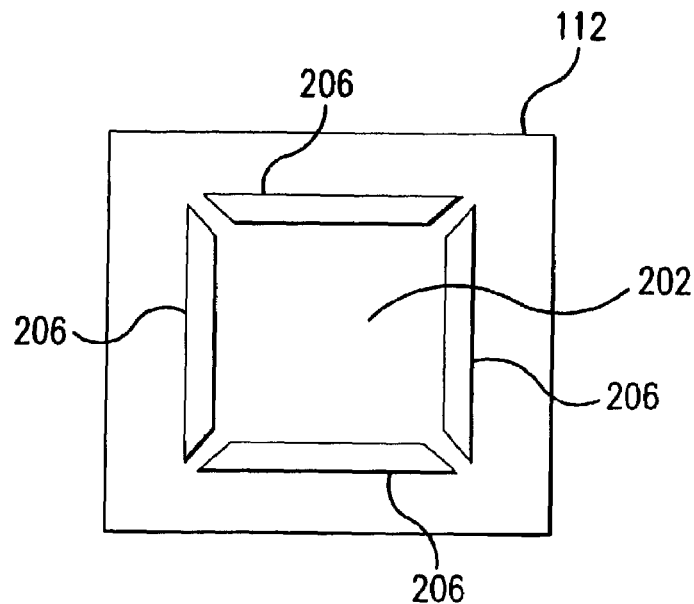
FIG. 2C shows an top view of an alternative stiffener configuration.

FIG. 2C shows a top view of an alternative configuration for stiffener 112, according to an embodiment of the present invention. Stiffener 112 includes an opening 206 adjacent to all four sides of an IC die mounting position 202 in the center of stiffener 112. Openings 206 are similar to openings 114 of FIG. 2A, but of different shape. The different shape can enhance thermal transfer to the outer areas of stiffener 112, for example. Further alternatively shaped openings in stiffener 112 are applicable to the present invention, including elliptical or rounded openings, etc.

Figure 3A:
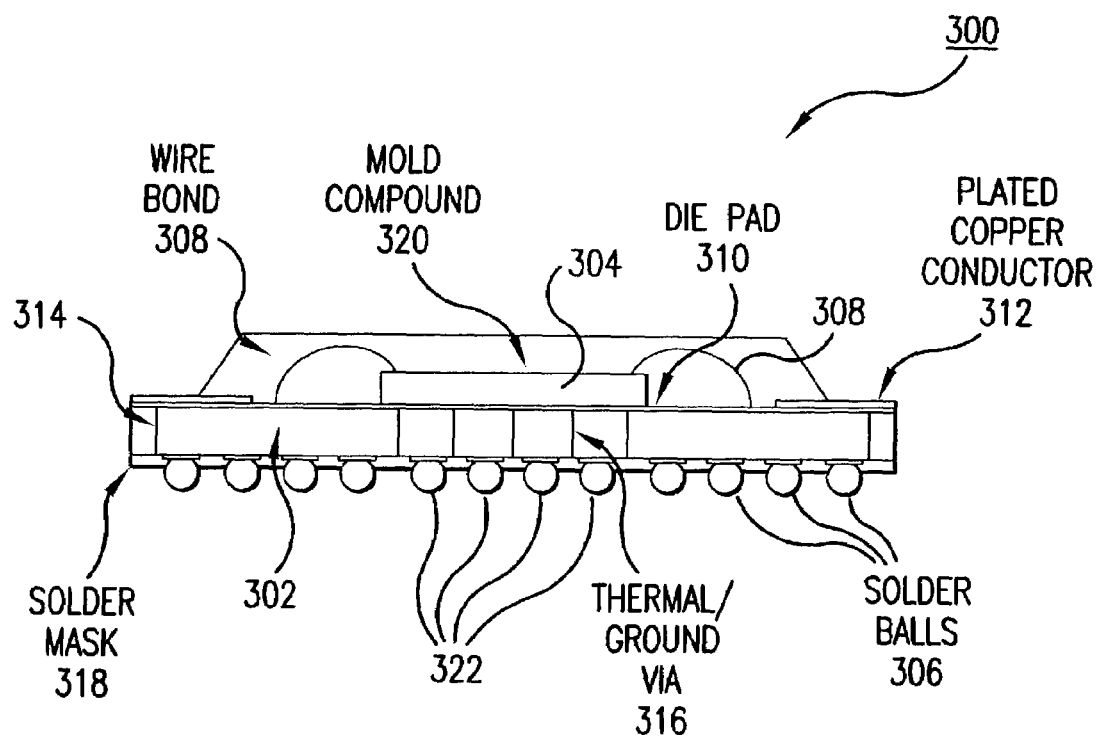
FIGS. 3A and 3B show cross-sectional views of conventional die-up plastic BGA packages.
Figure 3B:
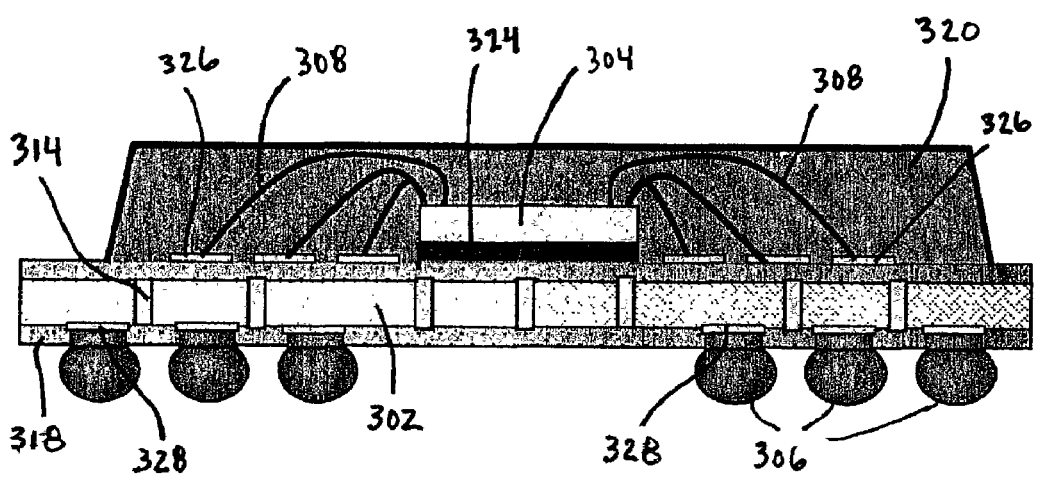

FIGS. 3A and 3B show cross-sectional views of conventional die-up PBGA packages 300. PBGA package 300 shown in FIG. 3A includes a plastic substrate 302, an IC die 304, a plurality of solder balls 306, a plurality of wire bonds 308, a die pad 310, one or more vias 314, and one or more thermal/ground vias 316.

Plastic substrate 302 includes one or more metal layers formed on an organic substrate (for example, BT resin or FR4 epoxy/glass). IC die 304 is mounted to die pad 310. Wire bonds 308 couple signals of IC die 304 to contact pads on the top surface of substrate 302. An encapsulate material 320 covers IC die 304 and wire bonds 308 for mechanical and environmental protection. For example, encapsulate material 320 may be a mold compound, epoxy, or other encapsulating substance. Solder balls 306 are formed on solder ball pads on the bottom surface of substrate 302. The solder ball pads are electrically coupled through substrate 302 to the contact pads on the top surface of substrate 302.

In the example shown in FIG. 3A, thermal/ground vias 316 connect die pad 310 to one or more thermal/ground balls 322 on the center bottom surface of substrate 302.

As shown in FIG. 3B, IC die 304 may be attached to die pad 310 with a die attach material 324. For example, die attach material 324 may be an epoxy, such as a silver-filled epoxy, an adhesive tape, or other adhesive material. Wire bonds 308 connect signals of IC die 304 to contact pads 326 of substrate 302. Contact pads 326 may be portions of bond fingers, traces, and pads accessible on the top surface of substrate 302. For instance, gold bonding wire is bonded from aluminum bond pads on IC die 304 to gold-plated contact pads 326 on substrate 302. The contact pads 326 on substrate 302 connect to solder balls 306 attached to solder ball contact pads 328 the bottom surface of substrate 302, through vias 314 and routing within substrate 302 using copper or other metal type conductors 312. Note that the example of PBGA package 300 shown in FIG. 3B does not include thermal/ground balls 322.

Figure 4A:
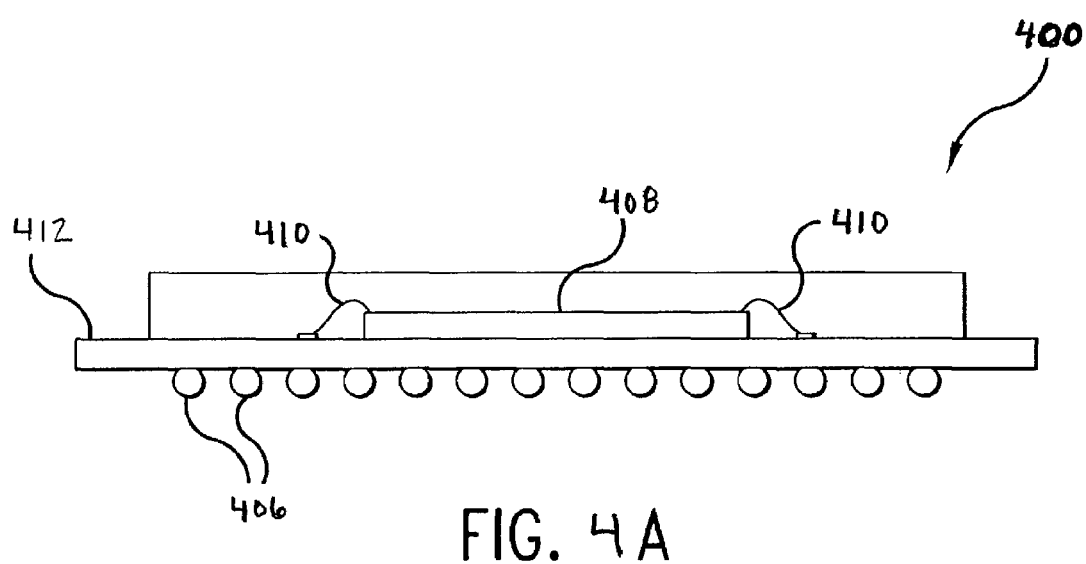
FIG. 4A illustrates a cross-sectional view of a die-up BGA package.
Figure 4B:
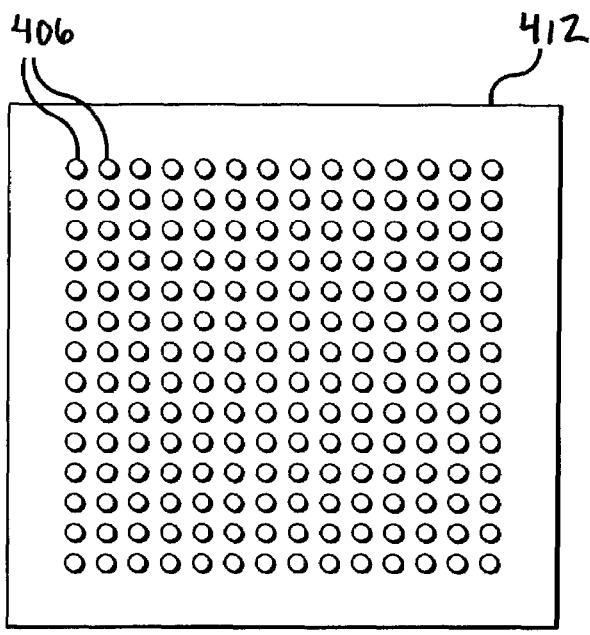
FIGS. 4B and 4C illustrate exemplary solder ball arrangements for the die-up BGA package of FIG. 4A.
Figure 4C:
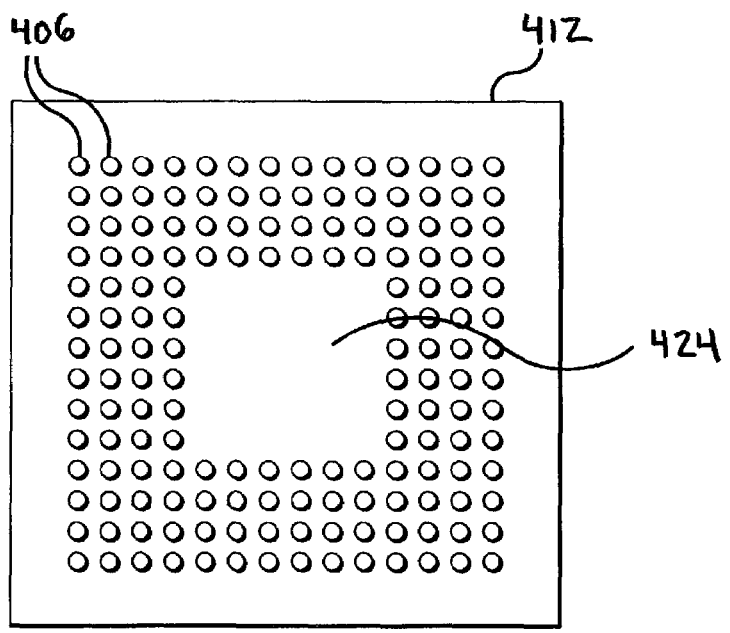

As described above, a BGA package includes an array of solder balls pads located on a bottom external surface of the package substrate for attachment of solder balls. FIG. 4A illustrates a cross-sectional view of a die-up BGA package 400. FIGS. 4B and 4C illustrate exemplary solder ball arrangements for die-up BGA package 400. As shown in FIG. 4A, BGA package 400 includes an IC die 408 mounted on a substrate 412. IC die 408 is electrically connected to substrate 412 by one or more wire bonds 410. Wire bonds 410 are electrically connected to solder balls 406 underneath substrate 412 through corresponding vias and routing in substrate 412. The vias in substrate 412 can be filled with a conductive material, such as solder, to allow for these connections. Solder balls 406 are attached to substrate 412, and are used to attach the BGA package to a PCB.

Note that although wire bonds, such as wire bonds 410, are shown and described herein, IC dies may be flipped and mounted to a substrate by solder balls located on the bottom surface of the IC die, by a process commonly referred to as "C4" or "flip chip" packaging.

As shown in FIG. 4B, solder balls 406 may be arranged in an array. FIG. 4B shows a 14 by 14 array of solder balls on the bottom surface of BGA package 400. Other sized arrays of solder balls are also applicable to the present invention. Solder balls 406 are reflowed to attach BGA package 400 to a PCB. The PCB may include contact pads to which solder balls 406 are bonded. PCB contact pads are generally made from a metal or combination of metals, such as copper, nickel, tin, and/or gold.

FIG. 4C shows a bottom view of BGA package 400, with an alternative solder ball array arrangement. BGA package 400 attaches an array of solder balls 406 on a bottom surface of substrate 412. As shown in FIG. 4C, solder balls 406 are located in a peripheral area of the bottom surface of substrate 412, away from a substrate center 424. For example, solder balls 406 on the bottom surface of substrate 412 may be located outside an outer profile area of an IC die mounted on the opposite surface of substrate 412. The solder ball array may be organized in any number of ways, according to the requirements of the particular BGA package application.

The present invention is applicable to any configuration or matrix of solders balls pads and solder balls, including full matrix, peripheral balls, center balls, etc.

Figure 5:
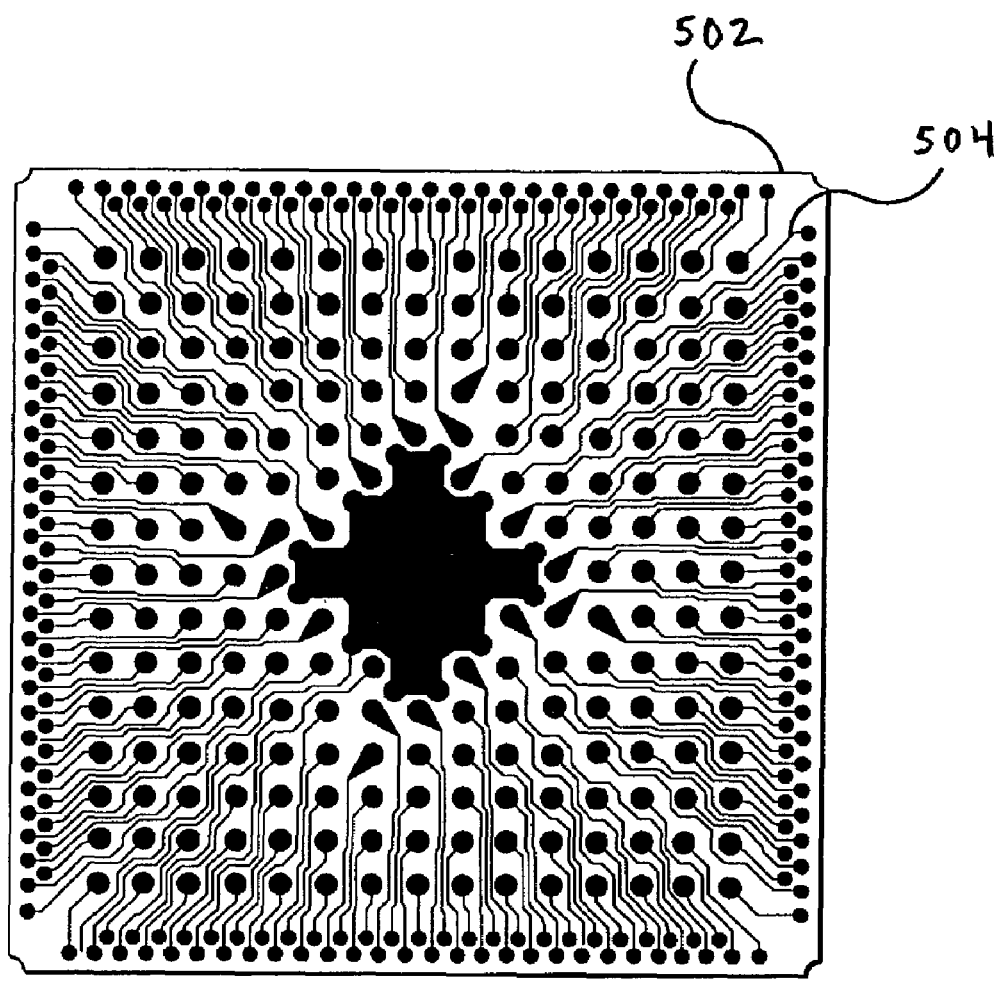
FIG. 5 shows exemplary routing in a substrate layer.

As described above, the BGA package substrate provides vias and routing on one or more layers to connect contact pads for wire bonds on its upper surface to solder balls attached to the bottom substrate surface. FIG. 5 shows an example routing 504 in a substrate layer 502 for accomplishing this.

Figure 6:
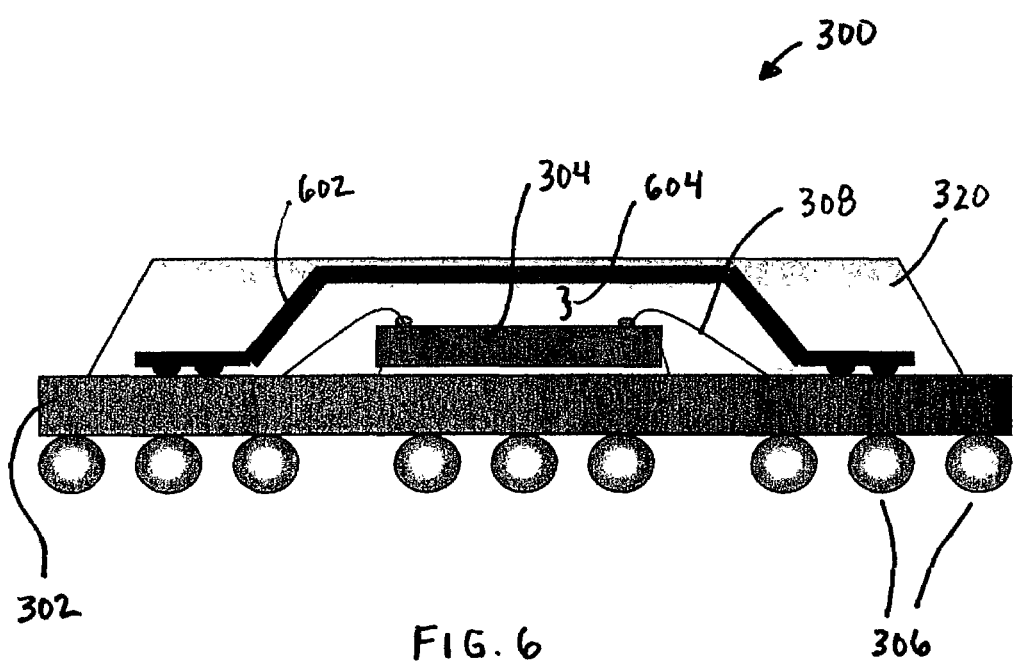
FIG. 6 illustrates a cross-sectional view of a die-up BGA package with heat spreader.

FIG. 6 shows a BGA package 300, that includes a heat spreader 602 coupled to the top surface of substrate 302. Heat spreader 602 improves heat dissipation from BGA package 300. Heat spreader 602 conducts heat from the top surface of IC die 304 away from BGA package 300 to the environment. However, there is a gap 604 between heat spreader 602 and IC die 304, and hence, heat does not efficiently conduct from IC die 304 to heat spreader 602. The present invention, as described herein, provides for improved thermal performance in a BGA package.

Ground and power wire bonds may be coupled to respective ground and power rings on the surface of the BGA package substrate. Such ground and power rings can often improve BGA package electrical performance by reducing BGA package inductances, and by saving space for signal input and output (I/O) wire bond connections. Typically, a ground ring is placed near to the IC die to reduce resistance and inductance of wire bonds so as to reduce ground bounce. One or more power rings for various supply voltages can be placed on the substrate surface further away from the IC die. Signal bond fingers are placed outside of the outermost power/ground ring, spaced according to applicable design rules/constraints. Various planes, traces, and vias are integrated in the substrate to connect ground and power voltages, and other signals, to the corresponding solder balls on the bottom substrate surface.

Existing BGA packages have limitations that affect their ability to be used for advanced IC die applications. As more functions are integrated into individual IC dies, the design of IC dies has more stringent requirements, including: (1) handling increasing power requirements; (2) handling increasing numbers of IC die I/O signals; (3) handling lower voltage values for IC die power supplies; (4) handling higher clock and data transfer signal frequencies; and (5) supporting decreasing IC die sizes. Conventional BGA package designs may use narrower trace widths, longer wire bonds, staggered bond pad arrangements, and larger BGA package sizes to overcome the above challenges. These techniques, however, have their own limitations.

For instance, increasing the length of wire bonds can lead to low yields due to the phenomenon of wire sweeping. As a result, it may be preferable to minimize the length of wire bonds in a BGA package to allow for more reliable assembly processes. In addition, wire bonds may be manufactured from expensive material, such as gold, and hence may be expensive. Hence, shorter wire bonds may be advantageous from a cost perspective also.

Furthermore, the number of ground and power rings that may be used on a BGA package substrate is limited by a maximum wire bond length and by a power/ground ring spacing requirement. Frequently, more power supply voltages are required by some IC dies, such as modem IC dies, than can be accommodated on a single substrate.

Still further, to reduce IC die power consumption, power supply voltage levels are being decreased. For example, typical digital core power supply levels have been reduced to 1.2–1.0 V for 0.13 μm wafer technology. A low power supply voltage value requires lower BGA package voltage drops for the IC die to operate properly. Unfortunately, BGA package inductances and resistances are related to the length of wire bonds, and longer wire bonds can lead to increased voltage drops.

IC die clock and I/O data transfer frequencies are increasingly becoming higher. The rise times for signal currents are becoming shorter, and the rate of change of signal currents is becoming higher. IC dies having short current signal rise times, high change rates for signal currents, and low power supply voltage values have much more stringent restrictions on acceptable BGA package voltage level drops (including voltage drops due to package inductance and resistance).

The present invention is applicable to improving thermal and electrical performance in the BGA package types described herein, and further BGA package types.

BGA Package Inductance and Resistance

In a BGA package, as well as any other integrated circuit package type, by shortening a signal path, a package resistance, as well as inductance, may be lowered. This is especially important for power and ground signals. Reducing power and ground resistances and inductances may benefit the package in the following ways:

1. For core power and ground: Lower resistance and inductance will reduce the core power supply droop. The lower resistance can reduce the IR voltage drop and the lower inductance can reduce the voltage change due to core current change. Low resistance and low inductance will benefit the IC die or chip when the core is operating at high or full speed.

2. For I/O power and ground: Lower power and ground resistance and inductance can reduce the I/O power supply droop, which can affect the timing margin of I/O signals. Lowering inductance reduces the local supply droop so as to improve the ground bounce and power bounce. As would be understood to persons skilled in the relevant art(s), the ground bounce and power bounce often cause "false" switching of I/O signals. By lowering inductance, the "bounce" noise may be reduced.

There are several ways to shorten a signal path in a package. A typical signal path in a BGA package includes a bonding wire (i.e., wire bond), which connects the IC die or chip to a bond finger or ring on the surface of the substrate. Conductive traces of copper or other metal, and one or more vias, connect the bond finger or ring to the package solder balls. For power and ground, the traces are often replaced with corresponding conductive rings and planes. The total resistance and inductance of a signal may be calculated by summing the resistance and inductance of each above-mentioned path portion, in a first grade approximation.

Reducing wire bond lengths lowers the bond wire resistance and inductance. This section provides a simplified discussion on BGA package inductances, their relationship with wire bond lengths, and describes the relationship between BGA package inductance, ground bounce, and power voltage drop. Because the following discussion regarding inductance can similarly be applied to resistance, only inductance will be discussed in the following paragraphs for illustrative purposes. However, the same principals also apply to an analysis of resistance.

The voltage drop or ground bounce due to package inductance can be described by a simplified formula in Equation 1:

$$V \propto L \frac{dI}{dt} \qquad \text{Equation 1}$$

Where:
L=the inductance;
V=a change in voltage caused by the inductance;
dI/dt=the time variation of current.

Equation 1 shows that the voltage drop is proportional to the package inductance L.

A partial self inductance (L) per unit length of a wire bond of a finite radius r, a length l, permeability constants $\mu_1$ and $\mu_2$, and conducting a current i, is expressed in Equation 2 for low frequencies:

$$L = \frac{1}{i}\int_0^a \mu_1 \frac{ir}{2\pi r^2}dr + \int_0^\infty \mu_2 \frac{i}{2\pi r}dr \qquad \text{Equation 2}$$

The left-most integration in Equation 2 corresponds to an internal inductance of the wire bond, and the right-most integration in Equation 2 corresponds to an external inductance of the wire bond. For a wire bond in a BGA package in proximity to a ground plane, an external partial self inductance (L) is expressed by Equation 3:

$$L = \frac{\mu l}{2\pi}\left[\ln\left(\frac{4h}{d}\right) - 2\frac{h}{l}\right] \qquad \text{Equation 3}$$

Where:
l=the wire length;
h=the distance from l to ground plane;
d=the wire bond diameter.

Equation 3 shows that the inductance of a wire bond is proportional at the first level approximation to the wire length.

Equation 4 shows the inductance $L_{wires}$ for a number n of wire bonds for a particular signal net:

$$\frac{1}{L_{wires}} = \sum_1^n \frac{1}{L_j} \qquad \text{Equation 4}$$

Where:
$L_j$=the inductance of a wire bond j.

In electrical circuit packages, a total inductance $L_{package}$ is equal to the sum of inductances for all wire bonds, for the substrate, and for the solder balls, as is expressed in Equation 5:

$$L_{package} = L_{wires} + L_{substrate} + L_{solderball} \qquad \text{Equation 5}$$

From above discussion, there are several ways to reduce the package inductance: shortening wire bonds; adding to the overall number of wire bonds; adding more vias and solder balls; and, using large power and ground planes. However, it is difficult to implement the above mentioned ways in conventional BGA packages.

Because the clock and working frequencies of IC dies are becoming higher, especially for those with data transfer rates around or greater than the giga-Hertz (GHz) range, 50 Ohm impedance conductors become increasingly important. High frequency signal traces also require very short wire bonds, wide traces, and wider spacing from adjacent signal traces. Such an implementation occupies a great amount of space on the package substrate, and makes routing for a high pin count package even more difficult. The present invention, as described herein, provides a solution for many of these problems.

Integrated Circuit Package with Heat Sink Assembly of the Present Invention

Further details of structural and operational implementations of ball grid array packages of the present invention are described in the following sections. These structural and operational implementations are described herein for illustrative purposes, and are not limiting. For instance, the present invention as described herein may be implemented in both die-up and die-down BGA package types, as well as other IC package types, including land grid array (LGA), pin grid array (PGA), chip scale package (CSP), and quad flat pack (QFP) packages. Furthermore, each of the embodiments presented below are applicable to tape substrate BGA packages, plastic substrate BGA packages, ceramic substrate BGA packages, and other substrate types. The description below is adaptable to these and other package types, as would be understood to persons skilled in the relevant art(s) from the teachings herein.

Features of each of the embodiments presented below may be incorporated into BGA packages independently, or may be combined in any manner with the other features described herein, as would be apparent to persons skilled in the relevant art(s) from the teachings herein.

The present invention provides for improved thermal conduction from an IC die through a heat spreader, and provides for reduced package inductance. In embodiments of the present invention, a heat sink assembly is coupled to the IC die in a BGA package. The heat sink assembly of the present invention may also be referred to as a connection module. The heat sink assembly provides an enhanced thermal and electrical connection from the IC die to the package substrate.

Through the heat sink assembly, important signals of the IC die are coupled to BGA package solder balls, and hence to the PCB, by a lower inductance path than conventional paths that include lengthy wire bonds. The heat sink assembly forms a electrical connection path that can be used for ground, power and other critical signals. Furthermore, the first heat sink element and second heat sink element may be electrically segmented or divided to support a plurality of signals. Hence, any number of one or more signals may be electrically connected through the heat sink assembly, including ground, power, and other signals.

Because the second heat sink element is made of a metal or alloy, such as copper or aluminum, it has much lower inductance and resistance compared to conventional wire bonds. Hence, the second heat sink element significantly reduces the package voltage drop. Furthermore, the second heat sink element improves thermal dissipation from the IC die, by improving heat transfer to the environment. The first heat sink element further reduces the package inductance, and minimizes the voltage drop.

Inner wire bonds used to bond IC die signals to the heat sink assembly, as described below, effectively shorten the length of wire bonds for signals. As described above, shorter wire bonds greatly reduce the package inductance and resistance. Because the second heat sink element is made of a metal that is thicker than a wire bond, it reduces the package inductance and resistance further. Additionally, when the second heat sink element is used for ground, it can further reduce signal wire inductance by providing ground shielding.

The first heat sink element, when formed with bumps to conform to an IC die with corresponding passivation openings, combines the advantages of wire bonding and a flip chip configuration. A very short signal path is provided due to the close proximity of the first heat sink element bumps and IC die, which leads to a lower voltage drop.

Furthermore, the thermal performance of the BGA package with heat sink assembly is improved over that of conventional BGA packages due to the close proximity of the heat sink assembly to the IC die. They are coupled at the top surface of the IC die.

In embodiments, as described below, the heat sink assembly may include two- and single-heat sink elements. The single heat sink element embodiments combine advantages of the two heat sink elements described herein. For example, the single heat sink element may be configured to coupled to an IC die mounted in a standard configuration or a flip chip orientation, and in other ways described for two heat sink embodiments. Furthermore, single heat sink element packages may further be configured in additional ways, as described herein.

BGA Package/Heat Sink Assembly Embodiments of the Present Invention

Figure 7A:
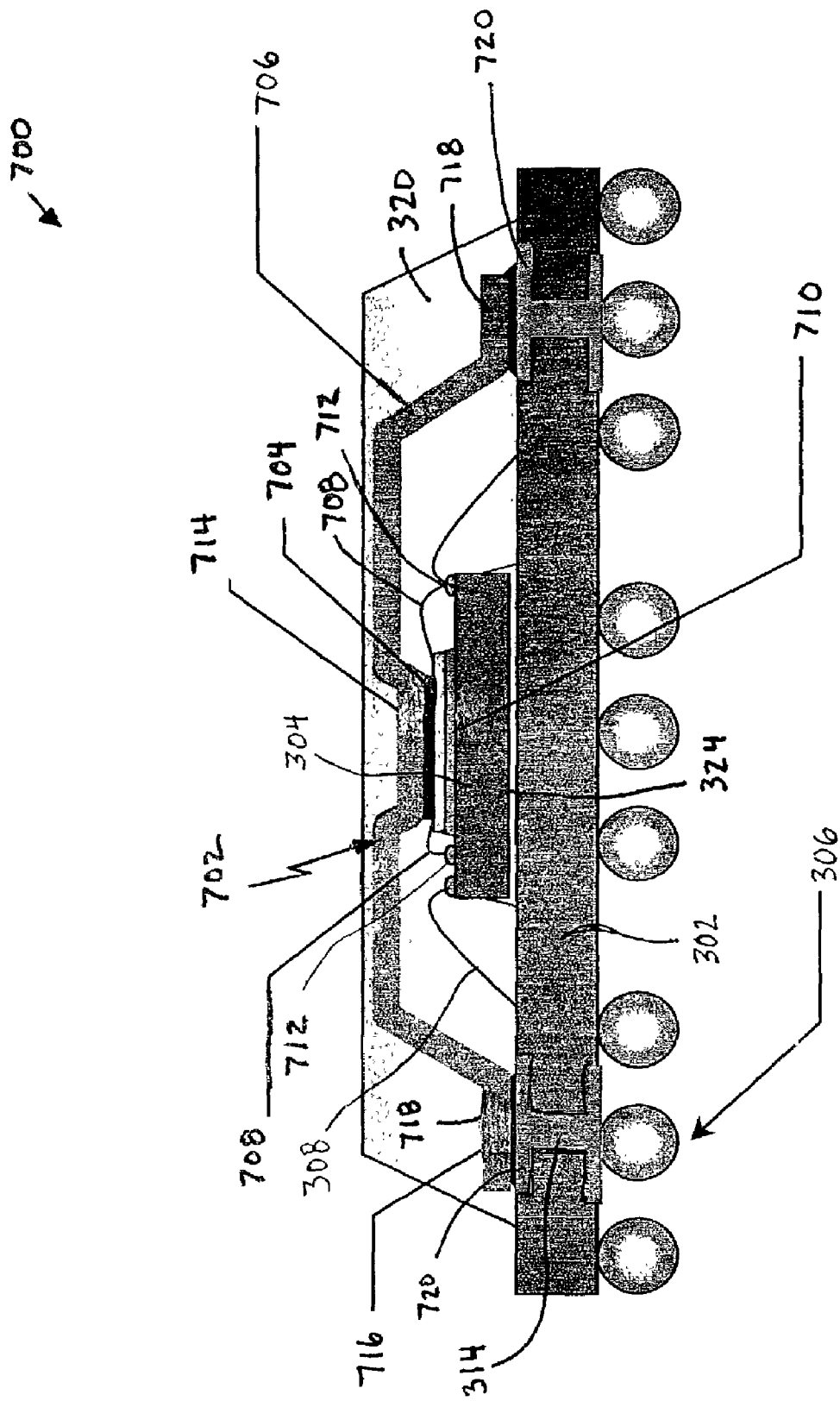
FIG. 7A shows a cross-sectional view of an example BGA package with an example heat sink assembly, according to an embodiment of the present invention.
Figure 7B:
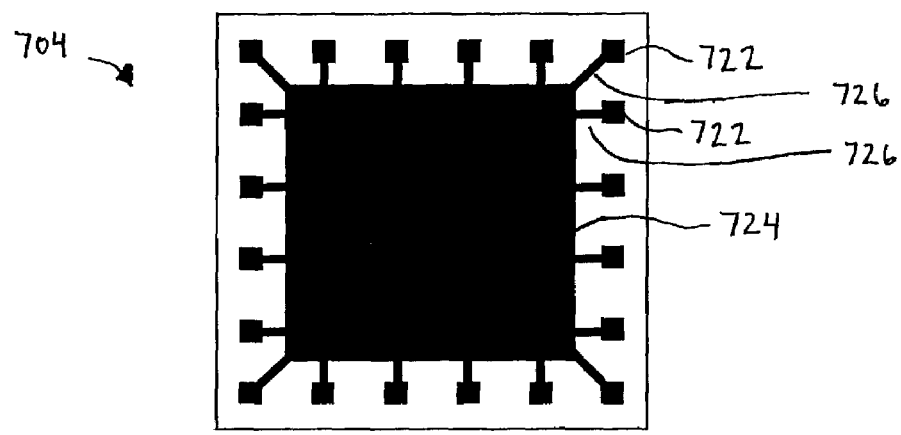
FIG. 7B shows a top view of a first heat sink element of the heat sink assembly shown in FIG. 7A, according to an embodiment of the present invention.
Figure 7C:
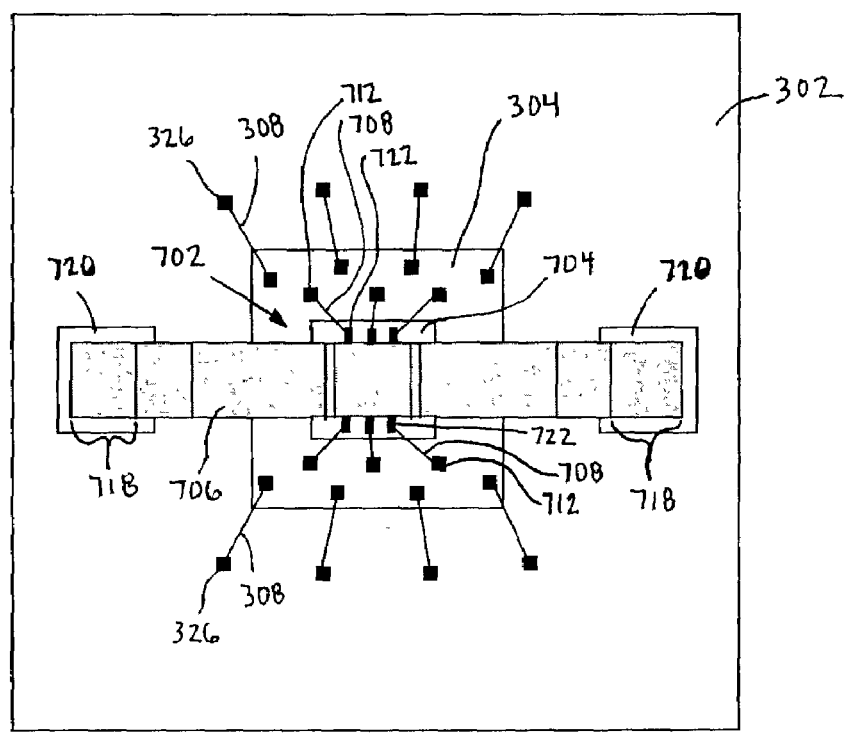
FIGS. 7C–7E show top views of the example BGA package of FIG. 7A with example heat sink assembly configurations, according to embodiments of the present invention.

FIG. 7A illustrates a cross-sectional view of a BGA package 700 that includes a heat sink assembly 702, according to an embodiment of the present invention. FIG. 7C shows a top view of BGA package 700, without encapsulate material 320 and some surface features of substrate 302 visible. BGA package 700 is substantially similar to the BGA packages described above, subject to the differences described below. Heat sink assembly 702 includes a first heat sink element 704 and a second heat sink element 706, according to an embodiment of the present invention. First heat sink element 704 may also be referred to as an "inner connector," and second heat sink element 706 may also be referred to as an "outer connector." First and second heat sink elements 704 and 706 contribute to the thermal, electrical, and mechanical advantages of the present invention.

First heat sink element 704 is attached to the top surface of IC die 304 by an adhesive layer 710. Adhesive layer 710 may also act as a cushion layer to absorb an impact force that occurs during a wire bonding process, when wire bonds are attached to first heat sink element 704. Adhesive layer 710 may be an epoxy or adhesive film, or other adhesive material. In some applications, an adhesive thin film may provide relative ease in attachment to IC die 304, and a beneficial cushion effect. In an embodiment, adhesive layer 710 is a thermally conductive adhesive material, to enable thermal transfer from IC die 304 to heat sink assembly 702. Adhesive layer 710 may or may not be electrically conductive, depending on the particular application.

An adhesive layer 714 mechanically, thermally, and/or electrically couples first heat sink element 704 and second heat sink element 706. Adhesive layer 714 is typically an electrically and thermally conductive layer that couples first heat sink element 704 and second heat sink element 706. Materials that may be used for adhesive layer 714 include conductive epoxy (e.g., silver-filled), conductive film, and other thermally and electrically conductive adhesive materials. For example, a conductive tape or film may be used for adhesive layer 714. When used, the conductive film may be placed on the top surface of first heat sink element 704. A thermal compression bonding process may be used to bond second heat sink element 706 firmly to first heat sink element 704 using the conductive film. In embodiments, however, adhesive layer 714 may be electrically and/or thermally non-conductive, depending on the particular application.

An adhesive layer 716 mechanically, thermally, and/or electrically couples second heat sink element 706 to an exposed contact pad 720 of substrate 302. Materials that may be used for adhesive layer 716 include conductive epoxy (e.g., silver-filled), conductive film, and other thermally and/or electrically conductive adhesive materials. Contact pad 720 may be a metal pad, ring, trace, or other land type contact, for example. One or more vias 314, traces or planes in substrate 302 are used to electrically couple contact pad 720 to one or more corresponding solder balls 306. In embodiments, the corresponding solder balls are attached to the bottom surface of substrate 302 directly beneath contact pad 720. This may allow for a shortest electrical path for the respective signal, and lowest resistance and/or inductance. In other embodiments, however, the corresponding solder balls 306 may be located elsewhere on the bottom surface of substrate 302.

A top surface of first heat sink element 704 is wire bondable in a peripheral region, and is electrically conductive in a center region. For example, FIG. 7B shows a top surface of first heat sink element 704, according to an embodiment of the present invention. As shown in FIG. 7B, one or more bond pads 722 and a contact area 724 are formed on the top surface of heat sink element 704. Bond pads 722 may be bond fingers, pads, areas, rings, or other bond pad types. Bond pads 722 and contact area 724 are electrically conductive, and may be formed from conductive metals formed in or plated on first heat sink element 704, for example. Bond pads 722 are electrically coupled to contact area 724 by traces 726. Second heat sink element 706 is electrically coupled to contact area 724 when attached to first heat sink element 704 by adhesive layer 716. Hence, when wire bonds from IC die 304 are bonded to bond pads 722, they are electrically coupled to second heat sink element 706 through trace 726 and contact area 724.

One or more inner wire bonds 708 couple IC die bond pads 712 inwardly to the peripheral region of first heat sink element 704. In embodiments, inner wire bonds 708 are standard wire bonds. Inner wire bonds 708 can be attached or bonded between IC die 304 and first heat sink element 704 during the same manufacturing step as are other BGA package wire bonds, such as wire bonds 308. Inner wire bonds 708 may alternatively be applied during a separate manufacturing step. Inner wire bonds 708 can be bonded from either inner or outer rows of staggered bond pads 712 on IC die 304, for example. As shown in FIG. 7C, wire bonds 708 are bonded to bond pads 722 of first heat sink element 704. Note that, as described above, adhesive layer 710 may effectively absorb the impact force created when inner wire bonds 708 are applied to first heat sink element 704, and can aid in protecting the integrity of IC die 304.

Hence, a combination of inner wire bonds 708, first heat sink element 704, adhesive layer 714, second heat sink element 706, adhesive layer 716, and contact pad 720 allow for ground, power and/or other signals to be electrically coupled from IC die 304 to substrate 302, and hence to one or more corresponding solder balls 306.

In an embodiment, first heat sink element 704 is substantially planar, and may be rectangular, rounded, or otherwise shaped. First heat sink element 704 may be formed from a variety of materials, including a printed circuit board (PCB) substrate, a metal or alloy, silicon, and/or a single- or multi-layer tape. Example embodiments for each of these configurations of first heat sink element 704 are further described as follows.

(A) PCB substrate material: A single- or multi-layer PCB substrate is suitable for use as first heat sink element 704. PCB substrate materials are especially useful when necessary to connect more than one signal net through heat sink assembly 702. For example, bond pads or fingers for a same-signal net are coupled together in the PCB substrate of heat sink element 704, and are connected to a particular contact area of second heat sink element 706. Second heat sink element 706 may be segmented into two or more portions in order to couple different electrically isolated contact areas of first heat sink element 704 to corresponding contact pads of substrate 302.

(B) Metal: A metal may be used for first heat sink element 704 to improve thermal performance. For example, first heat sink element 704 may include copper, aluminum, tin, lead, gold, silver, nickel, or other metals, or combinations or alloys thereof. For instance, a standard lead frame material such as C7025 or EFTEC may be used. Inner wire bonds 708 are bonded to peripheral wire bondable plated pads or areas on first heat sink element 704.

(C) Tape: A single or multi-layer tape may be used for first heat sink element 704. For example, a two-layer tape may be conveniently used. With an adhesive layer already attached on the back side of the tape, a tape first heat sink element 704 may be easily attached to IC die 304.

(D) Silicon: A silicon piece or chip similar to IC die 304, with connecting circuits formed thereon, may be used as a first heat sink element 704. In such an embodiment, inner wire bonds 708 are bonded from bond pads 712 on IC die 304 to bond pads on the silicon first heat sink element 704.

Further materials, as would be known to persons skilled in the relevant art(s) from the teachings herein, are suitable for first heat sink element 704.

Second heat sink element 706 may be manufactured from a variety of materials, depending on the electrical and thermal performance desired. A metal may be used for second heat sink element 706 to improve thermal and electrical performance. For example, second heat sink element 706 may include copper, aluminum, tin, lead, gold, silver, nickel, or other metals, or combinations or alloys thereof. Second heat sink element 706 may also be manufactured from ceramic, graphite, plastic, and/or other materials.

In an embodiment, I/O bond pads of IC die 304 may be simutaneously coupled by wire bonds to substrate 302 and by inner wire bonds 708 to heat sink assembly 702. In this manner, heat sink assembly 702 may be removed from the BGA package for failure analysis, for example, while IC die 304 is still capable of operating.

Second heat sink element 706 may be shaped in a variety of ways, to allow connection between first heat sink element 704 and substrate 302. As shown in FIG. 7A, second heat sink element 706 is formed such that one or more of its ends 718 are allowed to contact substrate 302.

Figure 7D:
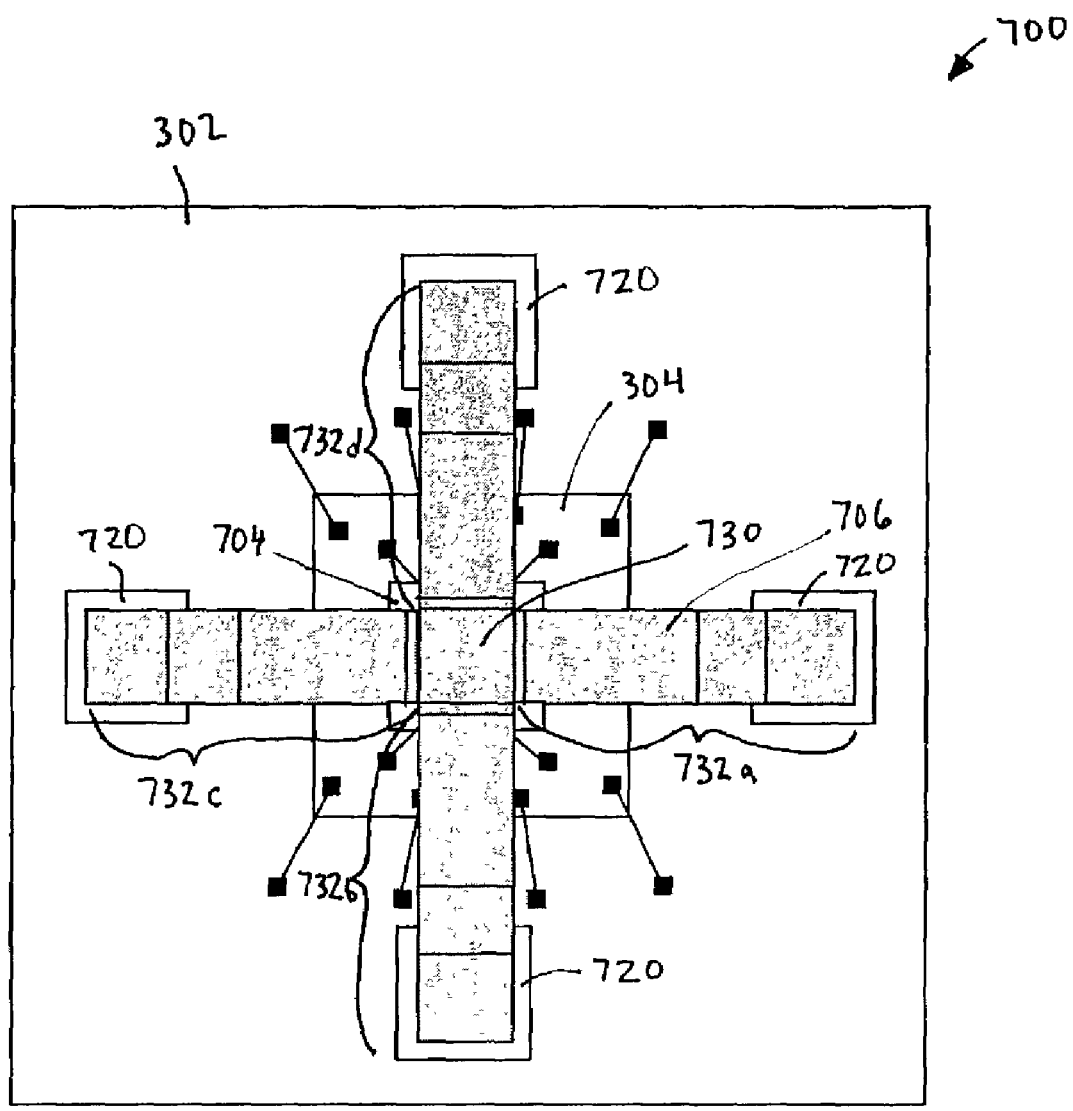
Figure 7E:
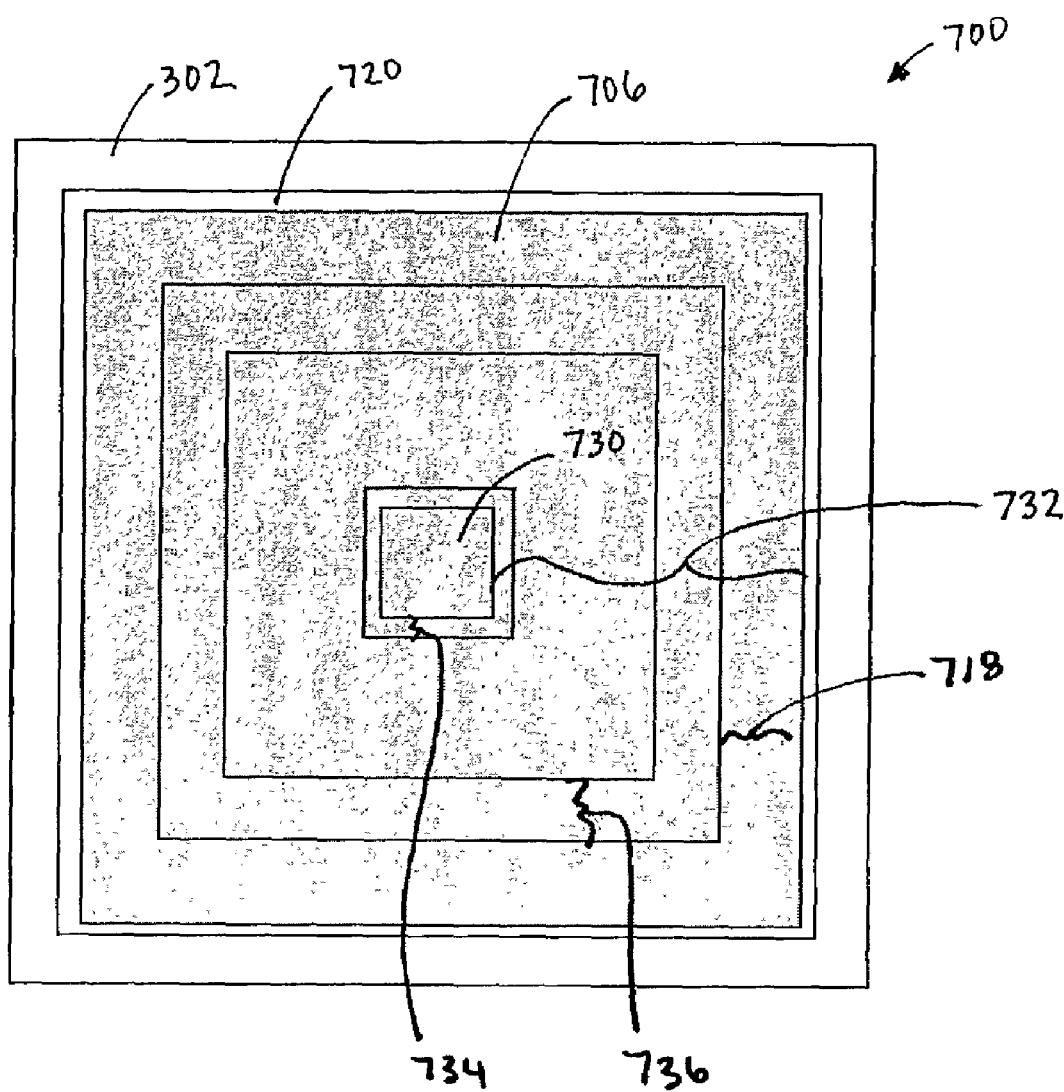
Figure 7F:
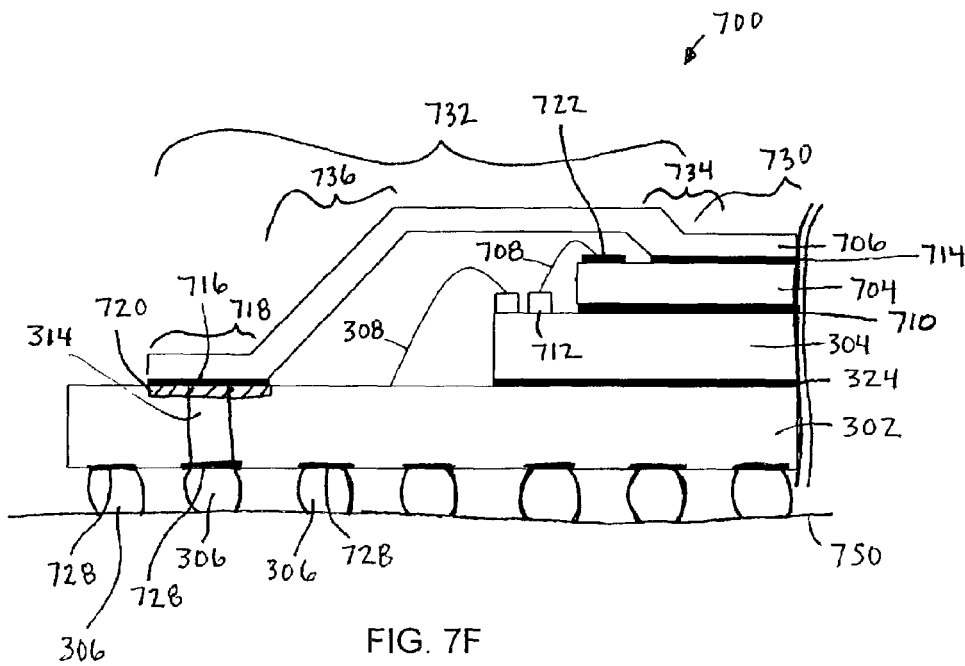
FIG. 7F shows a cross-sectional view of a portion of an example BGA package, according to an embodiment of the present invention.

FIG. 7F shows an cross-sectional view of a portion of an example BGA package 700 attached to an example PCB 750, according to an embodiment of the present invention. A plurality of solder balls 306 attached to a plurality of solder ball pads 728 on the bottom surface of substrate 302 attach BGA package 700 to PCB 750. As shown in FIG. 7F, second heat sink element 706 can be viewed as having a central region 730 (a portion of which is shown in FIG. 7F) and one or more arms 732 that extend from central region 730 to contact substrate 302. A bottom surface of central region 730 is coupled to the top surface of first heat sink element 704. In the embodiment of FIG. 7F, central region 730 is substantially planar. Furthermore, as shown in FIG. 7F, central region 730 is recessed. Note that in alternative embodiments, as described below, central region 730 does not have to be recessed.

In the example of FIG. 7F, arm 732 has a first arm portion 734 and a second arm portion 736 coupled in series. First arm portion 734 extends from central region 730 in an upward direction to allow arm 732 to avoid contact with inner wire bond 708 and wire bond 308. Second arm portion 736 extends in a downward direction to allow arm 732 to couple with contact pad 720 on the top surface of substrate 302. For the embodiment shown in FIG. 7A, this configuration forms an M-shaped cross-section for second heat sink element 706.

Figure 7G:
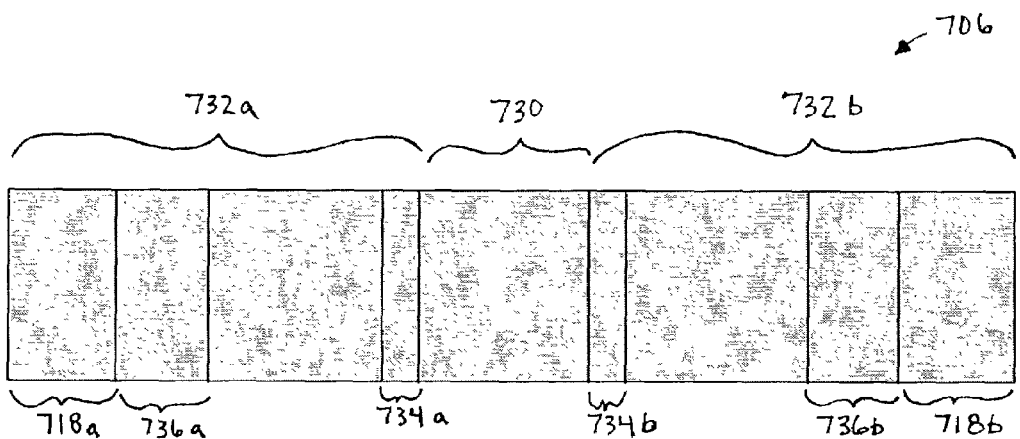
FIGS. 7G and 7H show top views of example second heat sink elements, according to embodiments of the present invention.
Figure 7H:
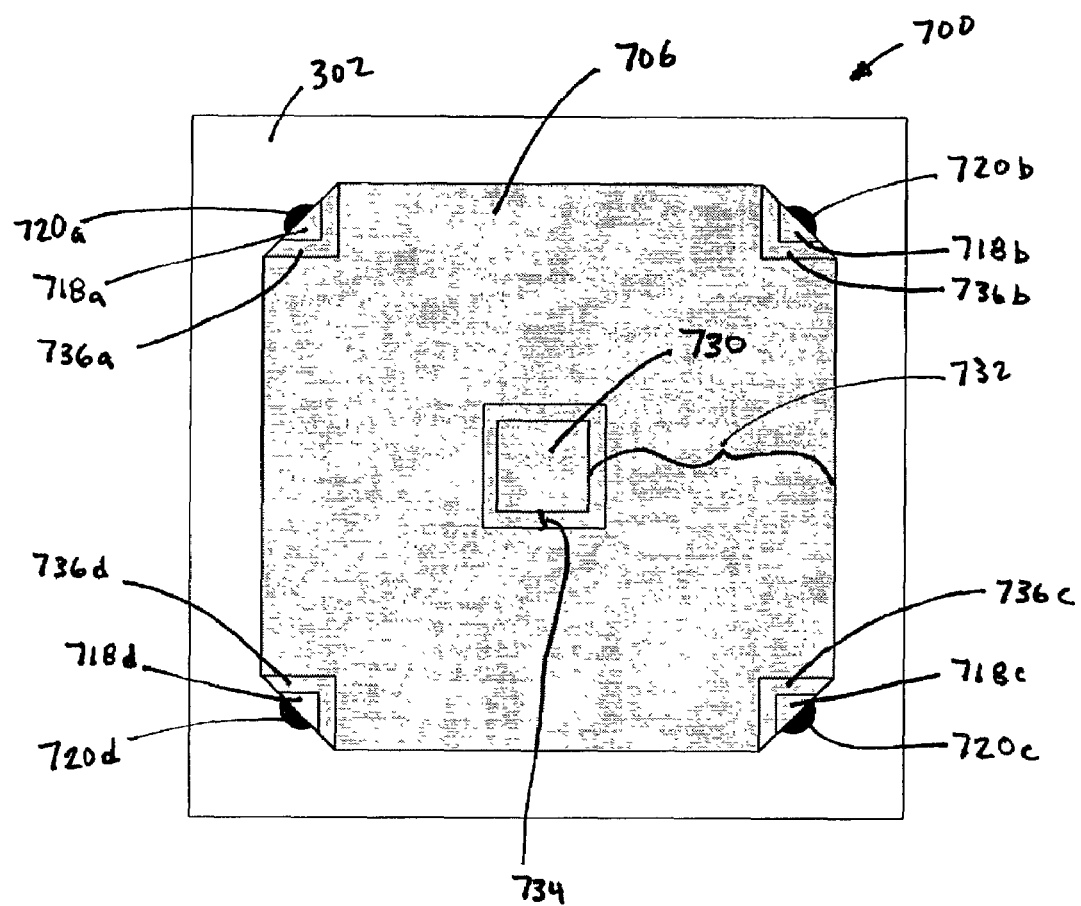

FIG. 7G shows second heat sink element 706 of FIG. 7A in further detail. As shown in FIG. 7G, second heat sink element 706 has first and second arms 732*a* and 732*b*. FIGS. 7D, 7E, and 7H show further example shapes for second heat sink element 706, from a top view, according to example embodiments of the present invention. As shown in FIG. 7D, second heat sink element 706 has first, second, third, and fourth arms 732*a*–732*d*. Second heat sink element 706 may have any number of one or more arms, as is required by the particular application.

As shown in FIGS. 7E and 7H, second heat sink element 706 may be thought of as having an arm 732 with a width that is continuous around central region 730. As shown in FIG. 7E, contact pad 720 is a continuous ring on the top surface of substrate 302. Contact pad 720 may also be separated into a plurality of contact pads in the configuration shown in FIG. 7E. As shown in FIG. 7H, second heat sink element 706 is coupled to four circular contact pads 720*a*–720*d* at corresponding corners or ends 718*a*–*d* of second heat sink element 706. Furthermore, the corners or ends 718*a*–*d* of second heat sink element 706 are formed in squared or "cut off" shape. Second arm portions 736*a*–736*d* of second heat sink element 706 are bent, stamped, molded, or otherwise formed so that ends 718*a*–*d* make contact with contact pads 720*a*–*d*. Note that the number of contact pads 720 may alternatively be greater or less than four, depending on the particular application.

In the embodiments of FIGS. 7E and 7H, second heat sink 706 is a relatively large plane that covers a large portion of the top surface of substrate 302. In this manner, second heat sink 706 is able to transfer more heat from IC die 304 to the environment.

Second heat sink element 706 may have alternative and additional shapes, as would be understood to persons skilled in the relevant art(s) from the teachings herein.

In further embodiments of the present invention, heat sink assembly 702 includes a single heat sink element. FIGS. 8A and 8D each illustrate BGA package 700 with heat sink assembly 702, according to single heat sink element embodiments of the present invention. In each of FIGS. 8A and 8D, heat sink assembly 702 includes a single-piece heat sink element that couples one or more signal nets of IC die 304 to substrate 302, in a similar fashion to that described for the two heat sink element embodiments described above. The single-piece heat sink element of the embodiments of FIGS. 8A and 8D includes benefits of both of first heat sink element 704 and second heat sink element 706, in a single piece.

In FIG. 8A, the single heat sink element or connector element of heat sink assembly 702 is heat sink element 802. Heat sink element 802 may be made from materials such as those from which first and second heat sink elements 704 and 706 may be made. Heat sink element 802 is preferably made from a metal material, with wire bondable plated areas 818 for attachment of inner wire bonds 708. Heat sink element 802 includes one or more formed portions or arms 806 that extend towards substrate 302 from a central region 814 for attachment to substrate 302, similarly to second heat sink element 706. In the embodiment shown in FIG. 8A, first and second arms 806a and 806b are shown. Arms 806 may be formed to conform relatively closely to IC die 304, to attach to substrate 302 at exposed contact pads 808 relatively closely to IC die 304. For example, contact pads 808 may be metal rings, traces, bond fingers, and other lands that are formed on substrate 302.

Figure 8B:
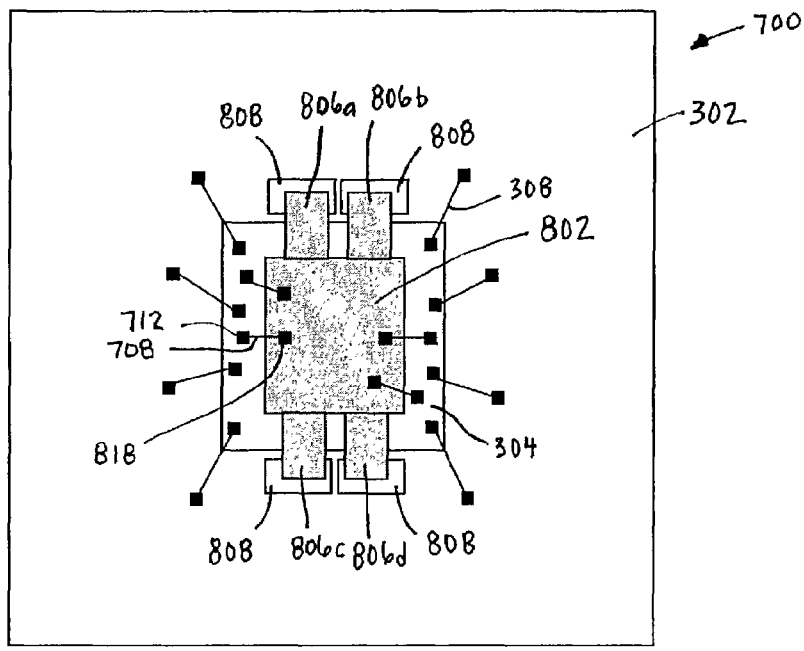
FIGS. 8B and 8C show top views of the example BGA package of FIG. 8A with example heat sink assembly configurations, according to embodiments of the present invention.
Figure 8C:
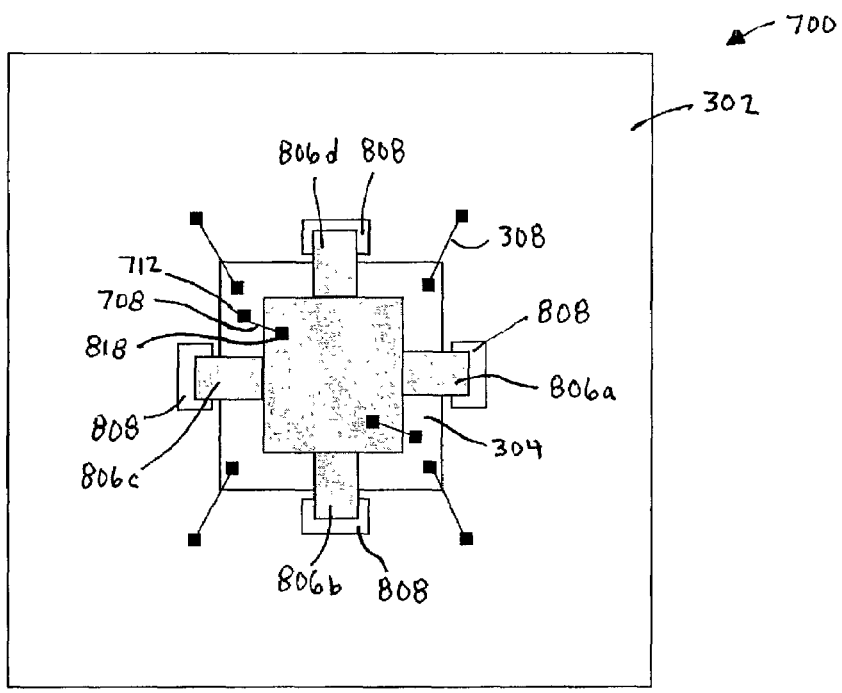

Similarly to second heat sink element 706, heat sink element 802 may be shaped in a variety of ways. For example, FIGS. 8B and 8C shows example top views of BGA package 700, with heat sink element 802, according to embodiments of the present invention. In FIGS. 8B and 8C, encapsulate material 320 and some surface features of substrate 302 are not shown. Heat sink element 802 may have any number of one or more arms 806. FIG. 8B shows heat sink element 802 with four arms 806a–806d, with two arms 806 extending to the substrate on each of two sides of IC die 304. FIG. 8C shows heat sink element 802 with four arms 806a–806d, with a single arm 806 extending to the substrate on each of the four sides of IC die 304.

In FIG. 8D, the single heat sink element of heat sink assembly 702 includes a single heat sink element 804. Heat sink element 804 may be made from materials such as those from which first and second heat sink elements 704 and 706 may be made. Heat sink element 804 is preferably made from a metal material, with wire bondable plated areas for attachment of inner wire bonds 708. Heat sink element 804 includes one or more formed portions or arms 810 that extend towards substrate 302 from a central region 816 for attachment to substrate 302. In the embodiment shown in FIG. 8A, first and second arms 810a and 810b are shown. Arms 810 may be formed to extend relatively far from IC die 304 on substrate 302, similarly to the structure of second heat sink element 706 shown in FIG. 7A, for example. Arms 810 attach to substrate 302 at exposed contact pads 812, which are substantially similar to contact pads 808 of FIG. 8A.

Figure 8E:
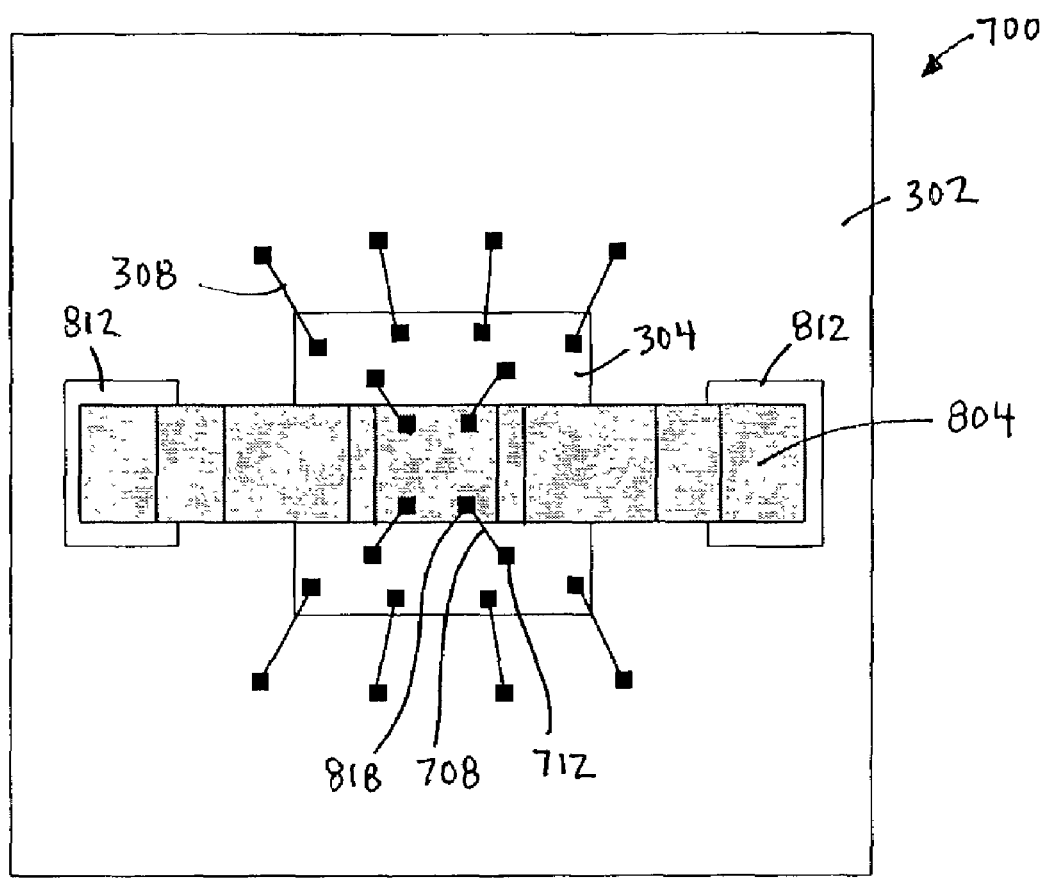
FIG. 8E shows a top view of the example BGA package of FIG. 8D with an example heat sink assembly configuration, according to embodiments of the present invention.

Similarly to second heat sink element 706, heat sink element 804 may be shaped in a variety of ways. For example, FIG. 8E shows an example top view of BGA package 700, with heat sink element 804, according to an embodiment of the present invention. In FIG. 8E, encapsulate material 320 and some surface features of substrate 302 are not shown. Heat sink element 804 is applicable to being shaped as elsewhere shown herein for other heat sink elements, including in the manner shown for second heat sink element 706 as shown in FIGS. 7A–7G. For example, heat sink element 804 may be formed to have a M-shaped cross-section, as shown in FIG. 8D, or may be otherwise formed.

Figure 9B:
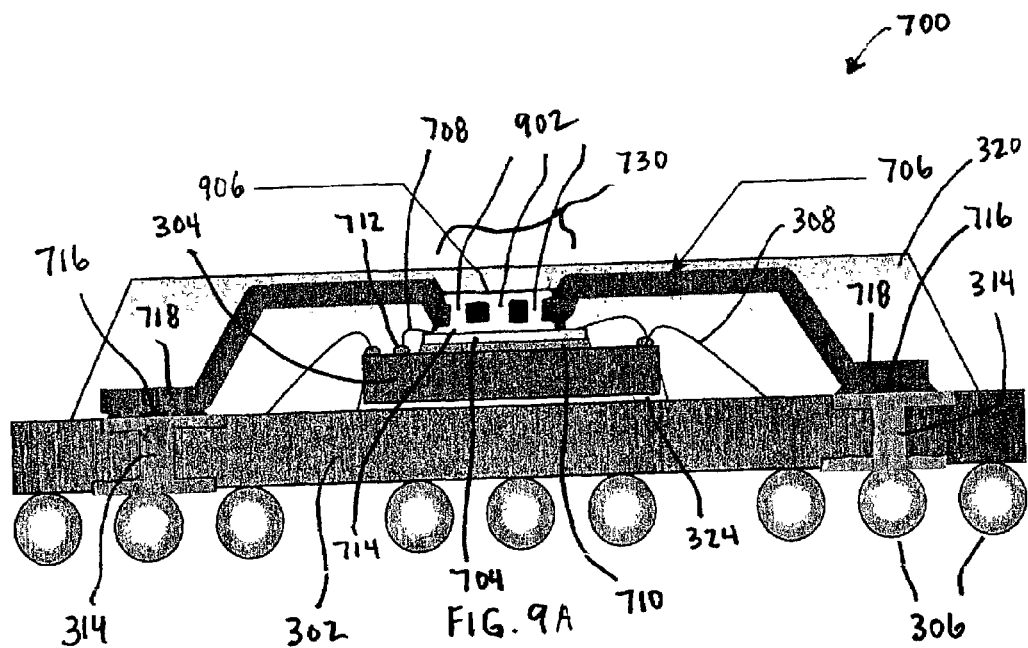
FIG. 9B shows a top view of the example perforated heat sink assembly of FIG. 9A, according to an embodiment of the present invention.
Figure 9B:
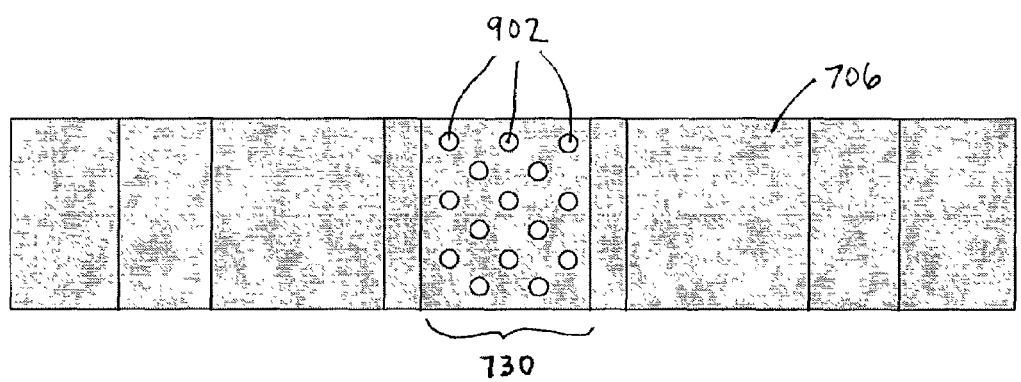

In an embodiment, a conductive epoxy may be dispersed on the top surface of first heat sink element 704 as adhesive layer 710, and then second heat sink element 706 may be placed on first heat sink element 704. The conductive epoxy is typically cured after placing second heat sink element 706 on first heat sink element 704. Furthermore, in an embodiment, second heat sink element 706 may be perforated. For example, FIG. 9A shows a cross-sectional view of a BGA package 700 that includes a second heat sink element 706 with one or more perforations 902, according to an embodiment of the present invention. FIG. 9B shows a top view of second heat sink element 706 of FIG. 9A. The perforated second heat sink element 706 may have perforations 902 in center region 730 of the top surface of second heat sink element 706.

As shown in FIG. 9A, a conductive epoxy 906 may be applied to center region 730 of the top surface of second heat sink element 706, to fill in perforations 902 in second heat sink element 706. Conductive epoxy 906 may be used alternatively to, or combined with adhesive layer 714 to better thermally, mechanically, and/or electrically couple second heat sink element 706 to first heat sink element 704.

Figure 9C:
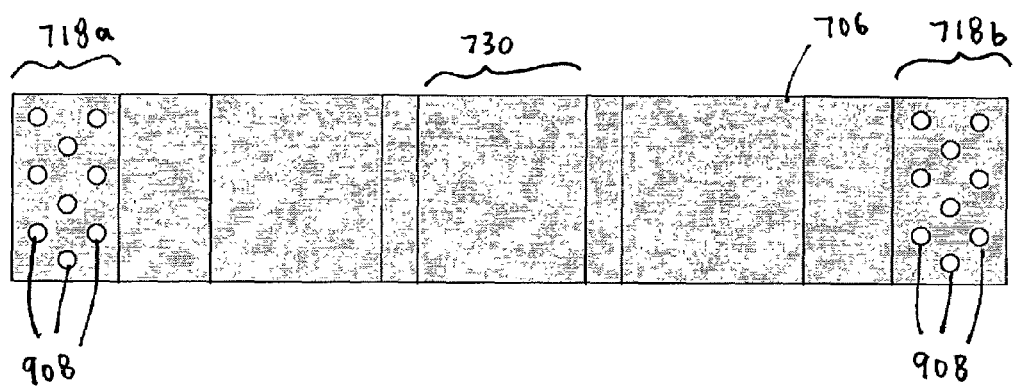
FIGS. 9C and 9D show top views of example perforated heat sink assemblies, according to embodiments of the present invention.
Figure 9D:
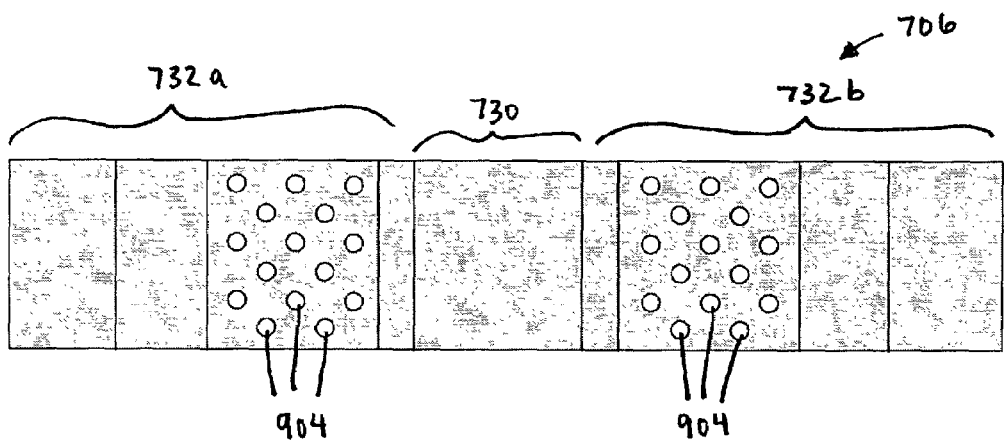

Second heat sink element 706 may be additionally or alternatively perforated in other portions. FIGS. 9C and 9D show top views of second heat sink element 706, according to further embodiments of the present invention. Second heat sink element 706 may have perforations in one or more ends 718. For example, as shown in FIG. 9C, second heat sink element 706 has perforations 908 in first and second ends 718a and 718b. Second heat sink element 706 may also have perforations in any portion of one or more arms 732. For example, as shown in FIG. 9D, second heat sink element 706 has perforations 904 in first and second arms 732a and 732b.

Perforations 902, 904, and 908 can increase a contacting area and improve reliability. Perforations 902 enhance an electrical, thermal, and mechanical connection between first heat sink element 704 and second heat sink element 706. Perforations 908 enhance an electrical, thermal, and mechanical connection between second heat sink element 706 and respective contact pads 720 on substrate 302. Perforations 902 and 908 allow an excess adhesive material, such as an epoxy, to flow through them while bonding second heat sink element 706 to first heat sink element 704 and contact pad 720, respectively. Hence, the adhesive material does not spread as much horizontally, and adhesiveness between second heat spreader 704 and first heat sink element 704 and/or contact pad 720 is improved.

Perforations 904 provides for enhanced bonding between second heat sink element 706 and encapsulate material 320, and for void free encapsulation. For example, a molding compound applied to a BGA package will have improved interfacial bonding to second heat sink element 706 with perforations 904. The molding compound at the top and bottom surfaces of second heat sink element 706 is allowed to join together through perforations 904, improving the adhesion of the molding compound to second heat sink element 706 and the BGA package. Furthermore, perforations 904 allow the molding compound to flow through second heat sink element 706 into "voids" or spaces under second heat sink element 706 that would be difficult or impossible for the molding compound to reach if it could only flow in from the sides of second heat sink element 706.

The number and size of perforations 902, 904, and 908 are determined on an application basis. Note that first heat sink element 704 and single heat sink elements 802 and 804 may also be perforated as described above, to provide similar benefits.

Note that in some perforated embodiments for second heat sink element 706, a specific portion of second heat sink element 706 may be left perforation-free, such as the geometrical center of heat sink element 706. This perforation-free location may allow a pick and place device to better attach to second heat sink element 706.

Figure 10A:
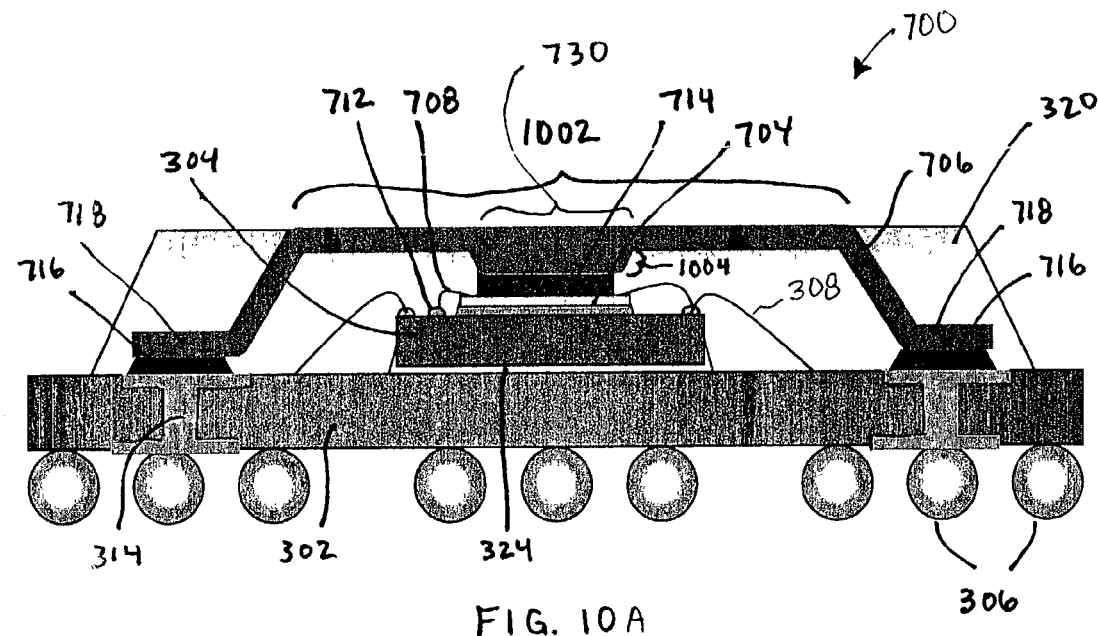
FIG. 10A shows a cross-sectional view of an example BGA package with an example heat sink assembly, according to an embodiment of the present invention.
Figure 10B:
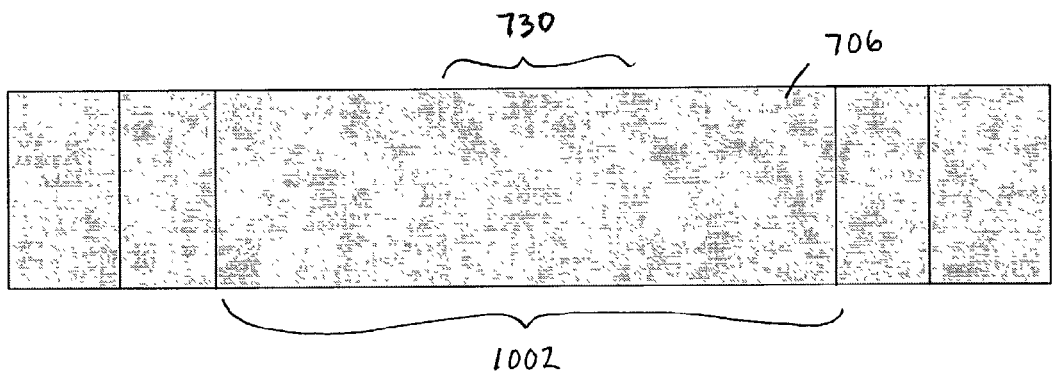
FIG. 10B shows a top view of the example heat sink assembly of FIG. 10A, according to an embodiment of the present invention.

An encapsulate material may be applied to the top surface of substrate 302, to protect IC die 304, wire bonds 308/708, and heat sink assembly 702. Second heat sink element 706 or single heat sink elements 802 and 804 may be completely encapsulated in BGA package 700 by encapsulate 320, such as shown in FIG. 9 for second heat sink element 706. Alternatively, a portion 1002 of second heat sink element 706 (or single heat sink element 802 or 804) may be exposed through encapsulate 320, as shown in FIG. 10A, according to an embodiment of the present invention. FIG. 10B shows a top view of second heat sink element 706 of FIG. 10A. Furthermore, as shown in FIG. 10A, in other embodiments, central region 730 of second heat sink element 706 (or single heat sink element 802) is not recessed.

In the embodiment of FIGS. 10A and 10B, second heat sink element 706 may be considered to be substantially planar in portion 1002 on its top surface, with a protruding portion 1004 on its bottom surface. Protruding portion 1004 is coupled to first heat sink element 704. Alternatively, protruding portion 1004 may be a piece separate from first and second heat sink elements 704 and 706, that is coupled between first and second heat sink elements 704 and 706. The separate-piece protruding portion 1004 may be made of any of the materials that first and second heat sink elements 704 and 706 may be made of, and other materials. An electrically and/or thermally conductive adhesive material may be used to attach the separate-piece protruding portion 1004 to first and second heat sink elements 704 and 706.

Figure 11A:
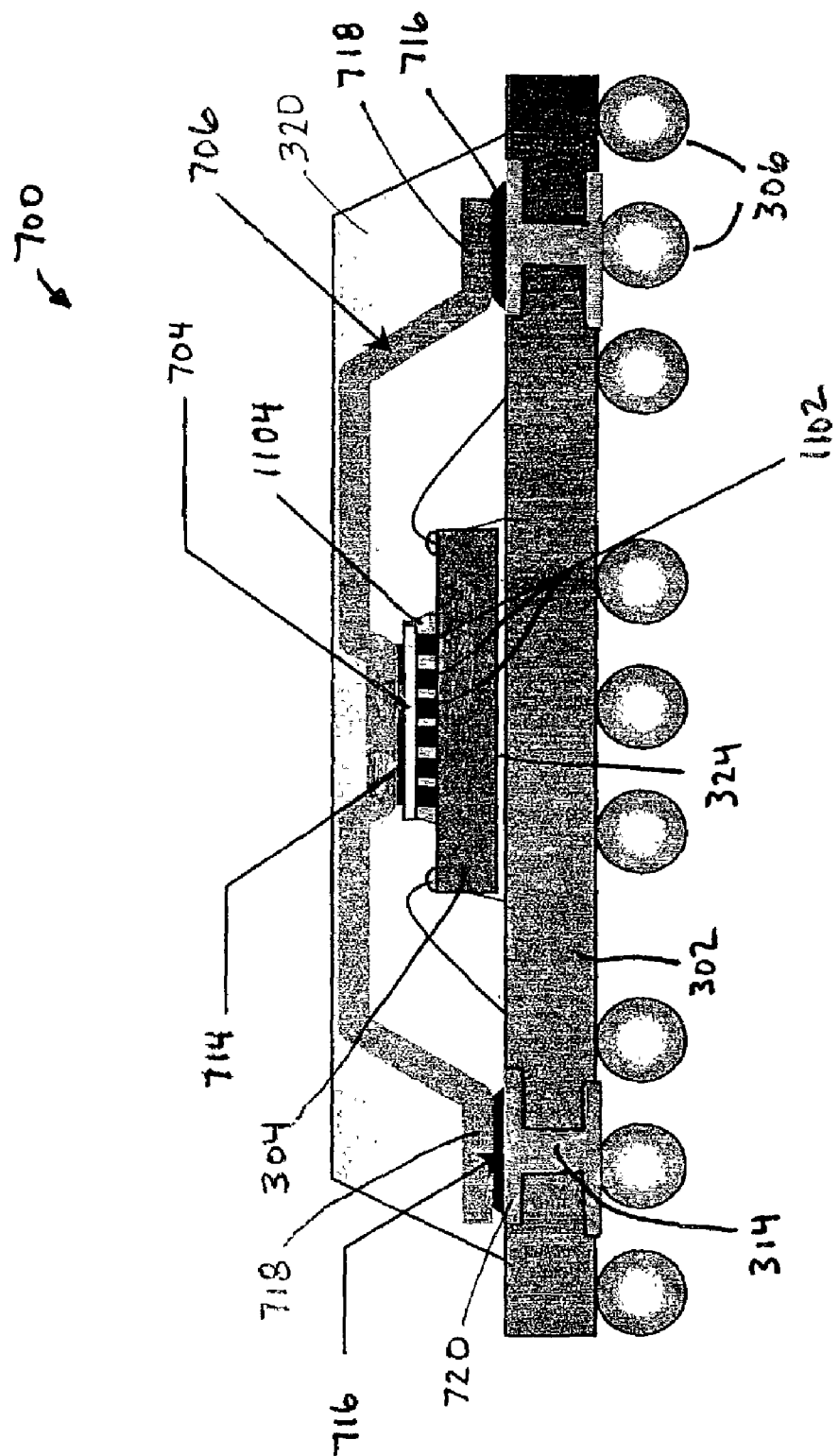
FIG. 11A shows a cross-sectional view of an example BGA package with example heat sink assembly, according to an example embodiment of the present invention.

FIG. 11A shows an example configuration for BGA package 700, according to an embodiment of the present invention. In the embodiment shown in FIG. 11A, I/O pads of IC die 304 are electrically accessed by heat sink assembly 702 through the top surface of IC die 304.

Figure 11B:
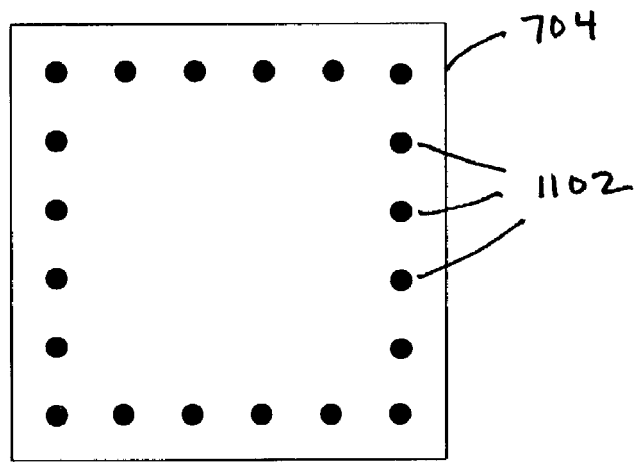
FIG. 11B shows an example surface of a first heat sink element of the example heat sink assembly of FIG. 11A that interfaces with an IC die through one or more passivation openings, according to an embodiment of the present invention.

For example, in FIG. 11A, first heat sink element 704 may be a PCB or tape substrate that is bumped with one or more conductive bumps 1102. For example, bumps 1102 may be gold, silver, aluminum, copper, other metal, or alloys or combinations of metals, or other conductive materials. Furthermore, a plurality of bumps 1102 may be arranged to form a pattern or matrix on the bottom surface of first heat sink element 704. For example, FIG. 1B shows the bottom surface of first heat sink element 704, according to an embodiment of the present invention. As shown in FIG. 11B, the bottom surface of first heat sink element 704 has a plurality of bumps 1102, formed in an example pattern. IC die 304 may be formed to have a corresponding pattern or matrix of passivation openings in its top surface to match the bumps 1102 of first heat sink element 704. Hence, one or more ground, power, and/or signal nets of IC die 304 can be electrically coupled to first heat sink element 704 by coupling of bumps 1102 to the signals exposed in the corresponding openings on the upper surface of IC die 304. The matching patterns or matrices can enhance the thermal, electrical, and mechanical coupling of first heat sink element 704 to IC die 304. First heat sink element 704 can be bonded to IC die 304 using a thermal compression process, for example. Inner wire bonds 708 may also be present, but are not required in the embodiment for BGA package 700 shown in FIG. 11A.

Figure 11C:
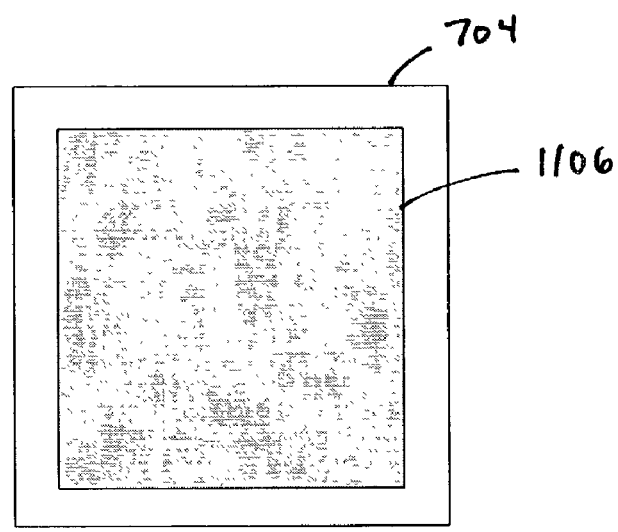
FIG. 11C shows an example surface of a first heat sink element of the example heat sink assembly of FIG. 11A that interfaces with a second heat sink element of the example heat sink assembly, according to an embodiment of the present invention.

FIG. 11C shows the top surface of first heat sink element 704, corresponding to the bottom surface of first heat sink element 704 shown in FIG. 11B, according to an example embodiment of the present invention. As shown in FIG. 11B, the bottom surface of first heat sink element 704 has an electrically conductive contact area 1106. One or more bumps 1102 are electrically coupled to contact area 1106 in first heat sink element 704, using conductive vias, etc. Second heat sink element 706 is electrically coupled to contact area 1106 when attached to first heat sink element 704 as described above, to electrically couple the one or more ground, power, and/or signal nets of IC die 304 to second heat sink element 704. Note that contact area 1106 may be segmented into a plurality of electrically isolated contact areas to support multiple ground, power, and/or signal nets of IC die 304.

Note that single heat sink elements 802 and 804 may be formed with one or more bumps 1102 to interface with I/O pads of IC die 304 in a single heat sink element embodiment. Hence, single heat sink elements 802 or 804 may each be configured to directly interface with signals of IC die 304 through passivation openings in the IC die 304. In such an embodiment, by using a single heat sink element and omitting inner wire bonds, a total parts count is reduced, and construction of the integrated circuit package is simplified.

As described above, the present invention is applicable to any number of ground, power, and signal nets being coupled to segmented portions of heat sink assembly 702. For example, two signal nets can be bonded to first heat sink element 704, such as ground and power. Electrically separate bond fingers are formed on first heat sink element 704. Ground and power I/O pads of IC die 304 are coupled to the electrically separate bond fingers. The bond fingers of first heat sink element 704 can be designed such that ground and power bond fingers have substantially the same length, and are placed next to each other.

Figure 12:
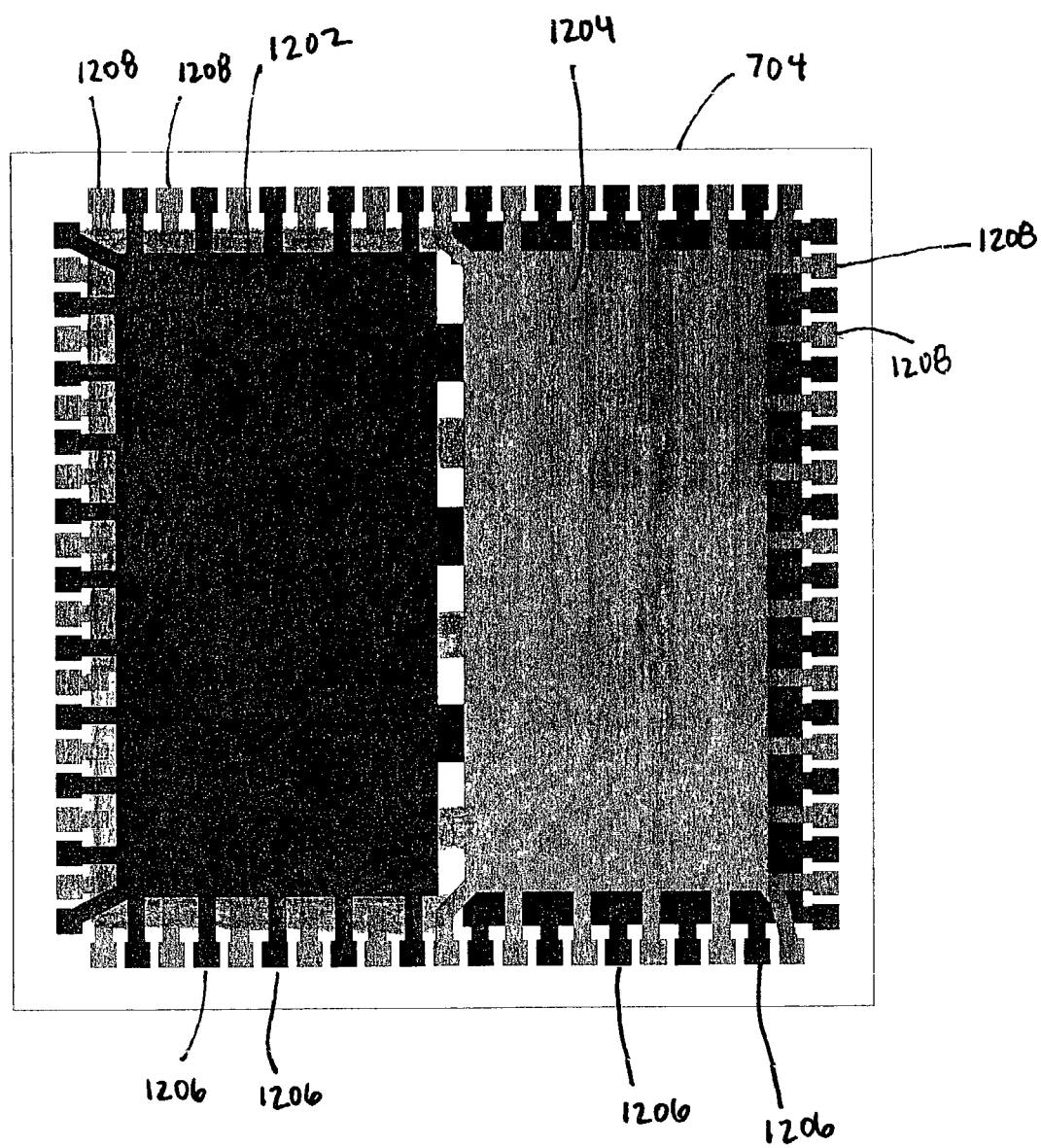
FIG. 12 shows an example segmented first heat sink element, according to an embodiment of the present invention.

FIG. 12 shows an example of first heat sink element 704 that is divided or segmented to allow for connection with a plurality of signals, according to an embodiment of the present invention. For example, FIG. 12 shows two contact area segments, first contact area 1202 and second contact area 1204, that each correspond to a different signal net. First and second contact areas 1202 and 1204 are exposed on the top surface of first heat sink element 704 for attachment to respective segmented portions of second heat sink element 706. In a standard IC die mounting orientation embodiment, inner wire bonds 708 are bonded to one or more bond pads or fingers of first heat sink element 704. Bond pads or fingers of one signal value are coupled internally in first heat sink element 704 to one of first and second contact areas 1202 and 1204. For example, as shown in FIG. 12, first bond fingers 1206 are coupled to first contact segment 1202, and second bond fingers 1208 are coupled to second contact segment 1204. For example, ground I/O pads of IC die 304 may be coupled to one or more of first bond fingers 1206, and power I/O pads of IC die 304 may be coupled to one or more of second bond fingers 1208.

Figure 13A:
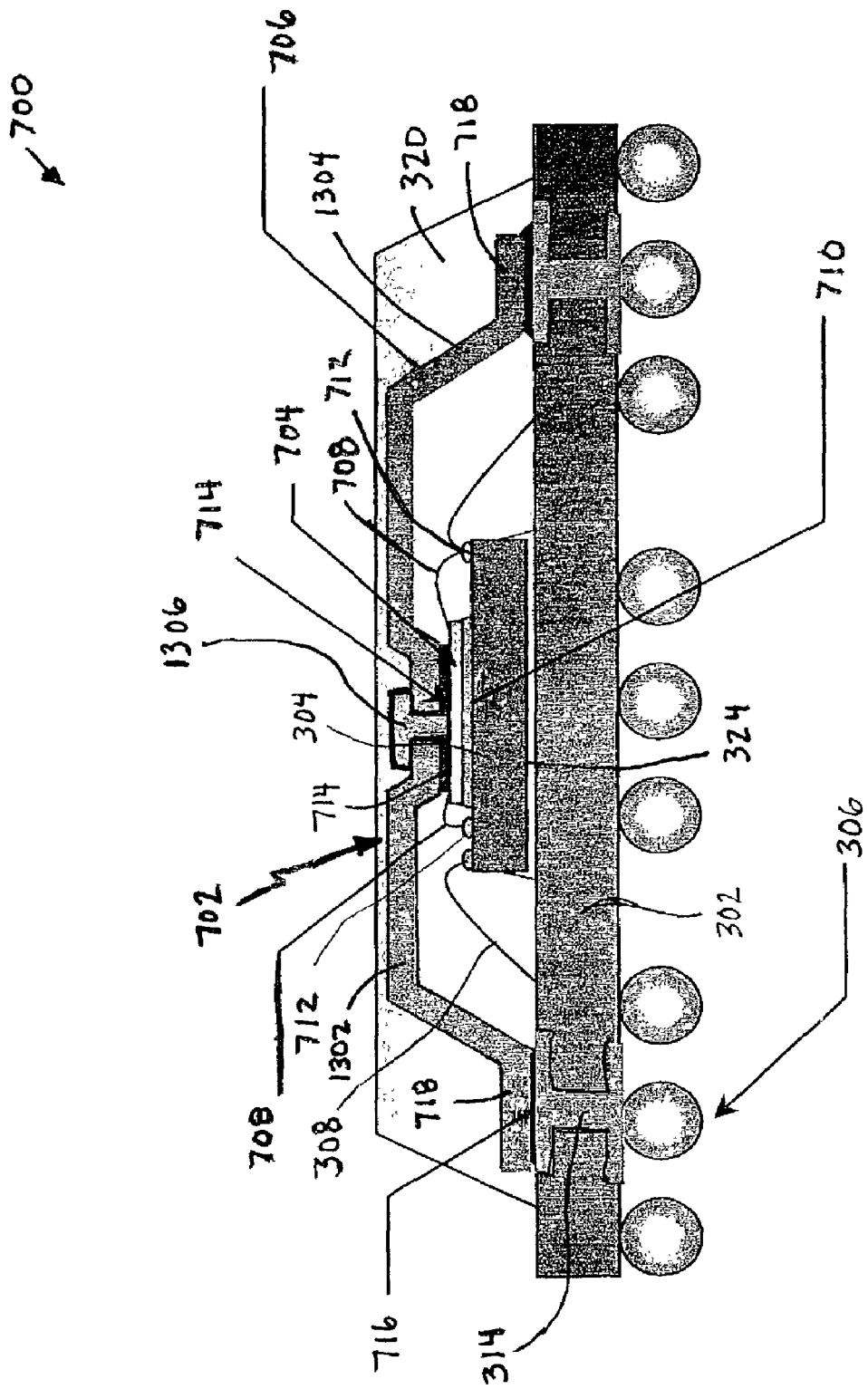
FIG. 13A shows a cross-sectional view of an example BGA package with segmented heat sink assembly, according to embodiments of the present invention.

FIG. 13A shows a cross-sectional view of BGA package 700 that includes a segmented heat sink assembly 702, according to an embodiment of the present invention. Heat sink assembly 702 includes a segmented second heat sink element 706, that has a first segment 1302a and a second segment 1302b. Essentially, first segment 1302a includes a first arm and a first portion of the central region of second heat sink element 706, and second segment 1302b includes a second arm and a second portion of the central region of second heat sink element 706. First segment 1302a and second segment 1302b are electrically insulated from each other, by an insulator 1306. First segment 1302a is coupled to a first contact area of first heat sink element 704, such as first contact area 1202, and second segment 1302b is coupled to a second contact area of first heat sink element 704, such as second contact area 1204. Hence, the combination of first segment 1302a and the first contact area of first heat sink element 704 allows for a first signal to be electrically coupled to substrate 302 with low inductance and resistance. The combination of second segment 1302b and the second area of first heat sink element 704 allows for a second signal to be electrically coupled to substrate 302 with low inductance and resistance. The first and second signals are electrically isolated.

Figure 13B:
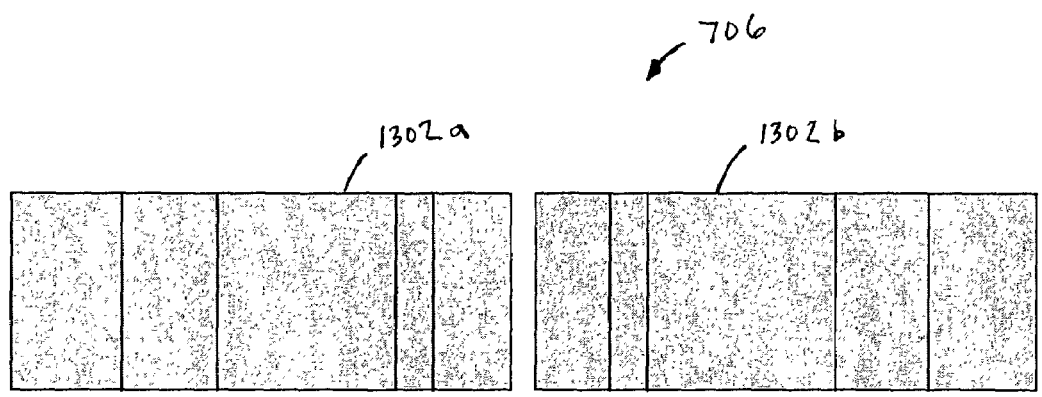
FIGS. 13B–13F show example segmented heat sink assemblies, according to embodiments of the present invention.
Figure 13C:
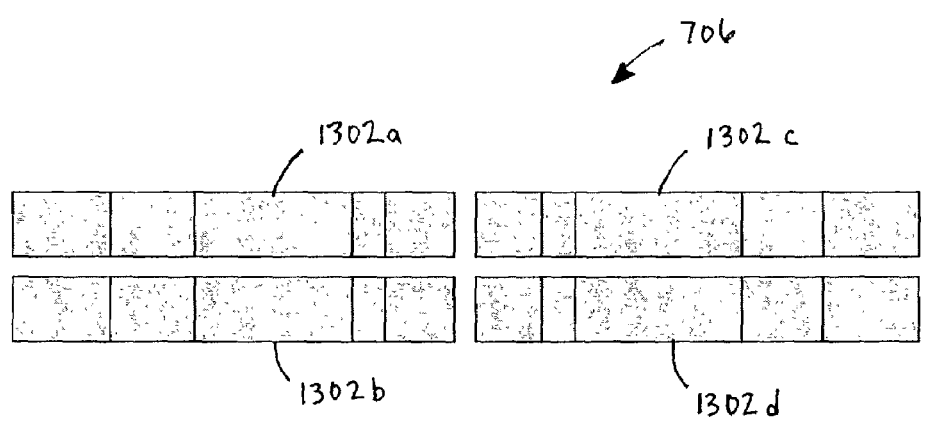
Figure 13D:
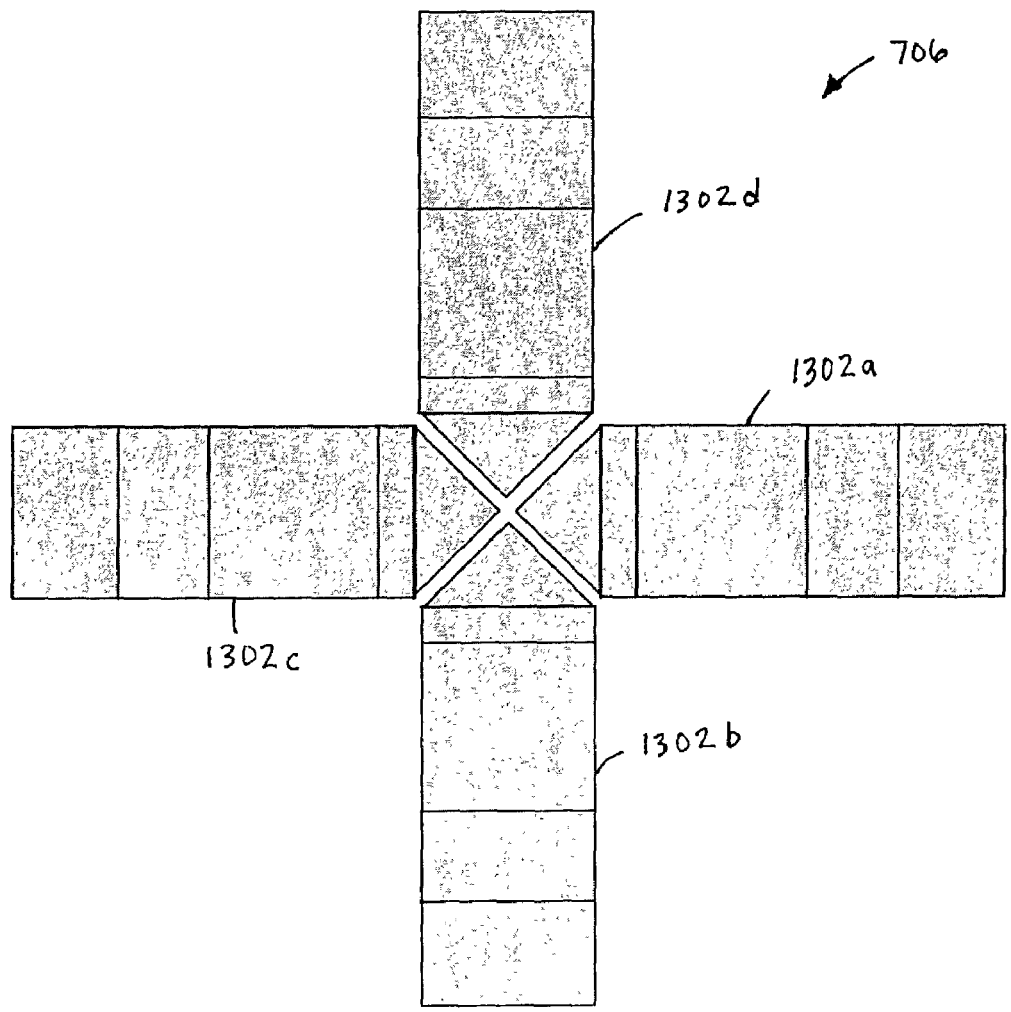

Heat sink assembly 702 may be segmented in a variety of ways. For example, FIGS. 13B–13D show examples of segmented versions of second heat sink element 706, according to embodiments of the present invention. FIG. 13B shows a segmented version of second heat sink element 706, with first and second segments 1302a and 1302b, that would be suitable for use with the segmented) first heat sink element 704 shown in FIG. 12. FIG. 13C shows a segmented version of second heat sink element 706 with four segments 1302a–1302d. FIG. 13D shows a cross-shaped segmented version of second heat sink element 706 with four segments 1302a–1302d.

Figure 13E:
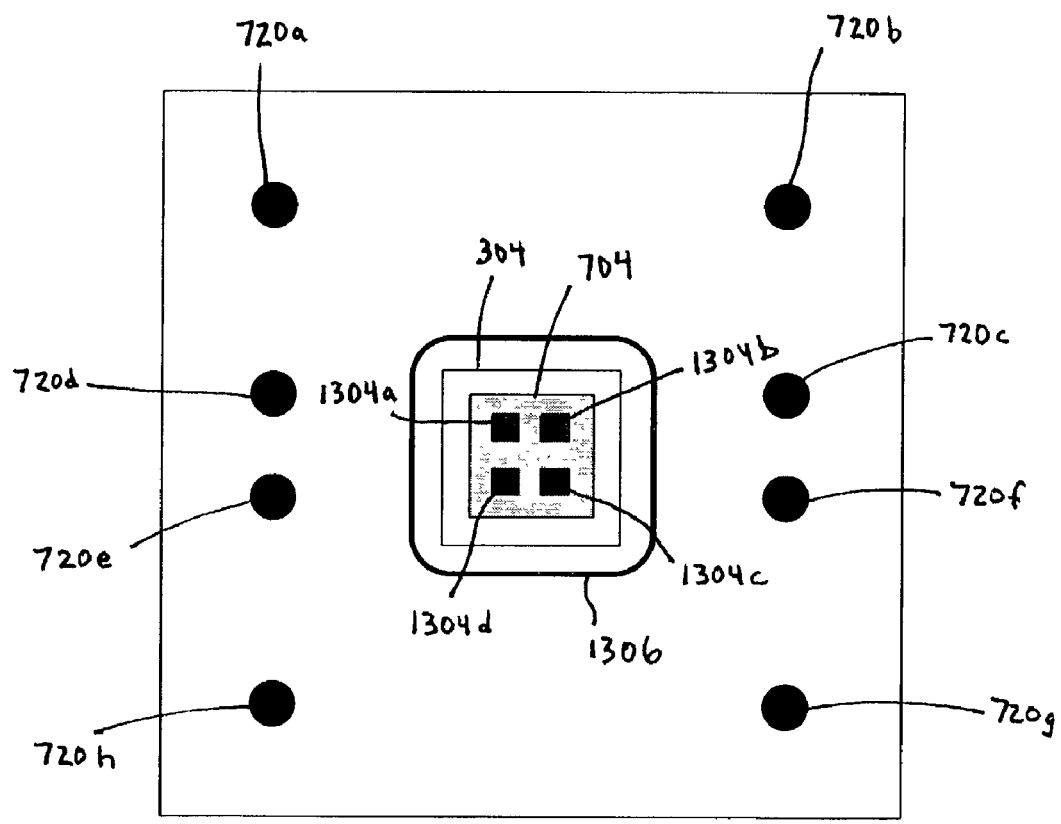
Figure 13F:
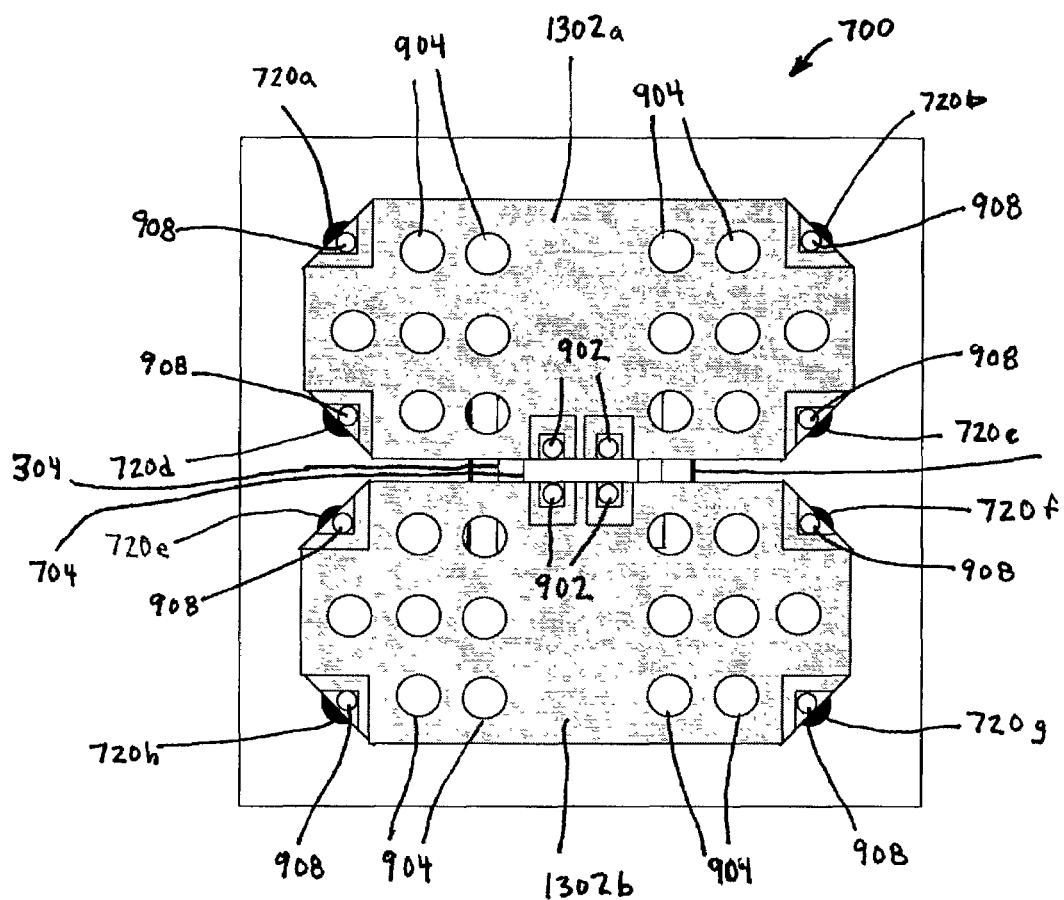

FIGS. 13E and 13F show top views of BGA package 700, according to another segmented embodiment for heat sink assembly 702. FIG. 13E shows a segmented first heat sink element 704 attached to IC die 304 in BGA package 700. FIG. 13F shows a segmented second heat sink element 706 attached to the segmented first heat sink element 704 of FIG. 13E.

As shown in the example of FIG. 13E, the top surface of first heat sink element 704 has four contact areas 1304a–d, for electrical coupling with second heat sink element 706. The top surface of substrate 302 has eight contact pads 720a–720h for coupling with second heat sink element 706. In the example of FIG. 13E, a ground ring 1306 surrounds IC die 304. Wire bonds (not shown in FIG. 13E) are coupled between I/O pads of IC die 304 and ground ring 1306, and between I/O pads of IC die 304 and bond fingers/traces on the top surface of substrate 302. Furthermore, inner wire bonds (not shown in FIG. 13E) may be coupled between I/O pads of IC die 304 and bond pads/fingers on the top surface of first heat sink element 704. Alternatively, inner wire bonds are not present, and first heat sink element 704 is electrically coupled to one or more signals in IC die 304 through one or more passivation openings in the top surface of IC die 304.

As shown in FIG. 13F, segmented second heat sink element 706 includes first and second segments 1302a and 1302b. First and second segments 1302a and 1302b are each similar to second heat sink element 706 shown in FIG. 7H, and include perforations 902, 904, and 908. First and second segments 1302a and 1302b are coupled between first heat sink element 704 and contact pads 720a–h. Hence, first and second segments 1302a and 1302b provide an electrical and/or thermal path between IC die 304 and contact pads 720a–h. As shown in FIG. 13F, first segment 1302 couples contact areas 1304a and 1304b to contact pads 720a–d, and second segment 1304 couples contact areas 1304c and 1304d to contact pads 720e–h.

Furthermore, perforations 902 enhance connection of first and second segments 1302a and 1302b to contact areas 1304a–d, as described above with reference to FIG. 9B. Perforations 904 enhance connection of an encapsulate material 320 (not shown in FIGS. 13E and 13F) to second heat sink element 706, as described above with reference to FIG. 9D. Perforations 908 enhance connection of second heat sink element 706 to contact pads 720a–h, as described above with reference to FIG. 9C.

Second heat sink element 706 may be segmented in any number of ways, as would be understood by persons skilled in the relevant art(s). First heat sink element 704 will be correspondingly segmented, to support electrical coupling and electrical isolation, as required by the particular segmented configuration of second heat sink element 706. When segmented, the separate segments of second heat sink element 706 may be attached to a BGA package separately, or they may be pre-joined, by insulator 1306 or other attachment mechanism, and then attached to the BGA package as a unit. Note that in some configurations, when second heat sink element 706 is segmented, a thermal stress on IC die 304 may be reduced relative to a thermal stress when second heat sink element 706 is not segmented. For example, the thermal stress may be reduced on the top surface of IC die 304 when the environmental temperature changes over a range such as from a low temperature to a high temperature, and vice versa.

Figure 14:
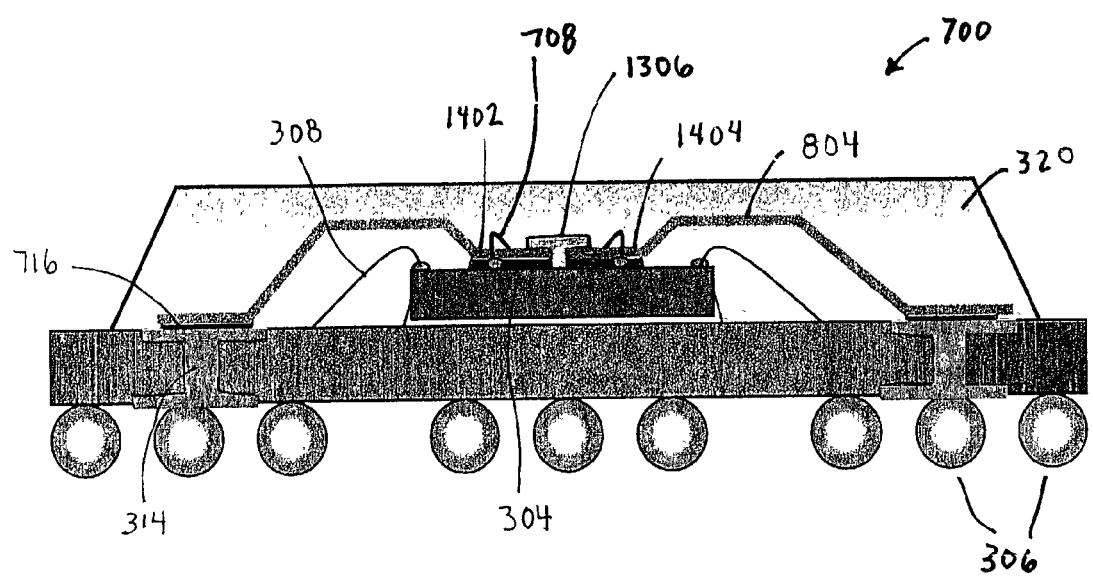
FIG. 14 shows a cross-sectional view of an example BGA package with segmented heat sink assembly, according to embodiments of the present invention.

Note that single heat sink elements 802 and 804 may also be segmented, according to embodiments of the present invention. FIG. 14 shows a cross-sectional view of an example of BGA package 700, with a segmented heat sink element 804, according to an embodiment of the present invention. Heat sink element 804 includes a first segment 1402 and a second segment 1404. First segment 1402 and second segment 1404 are electrically insulated from each other, by insulator 1306. Single heat sink element 802 may be segmented in a variety of ways, including in the manner of the examples shown for second heat sink element 706 in FIGS. 13A–13D. When segmented, the separate segments of single heat sink elements 802 and 804 may be attached to a BGA package separately, or they may be pre-joined, by an insulator or other attachment mechanism, and then attached to the BGA package as a unit.

Furthermore, first heat sink element 704 may be segmented. Similarly to segmented second heat sink element 706 and segmented single heat sink elements 802 and 804, a segmented first heat sink element 704 the separate segments of first heat sink element 704 may be attached to an IC die separately, or they may be pre-joined, by an insulator or other attachment mechanism, and then attached to the IC die as a unit.

Figure 15A:
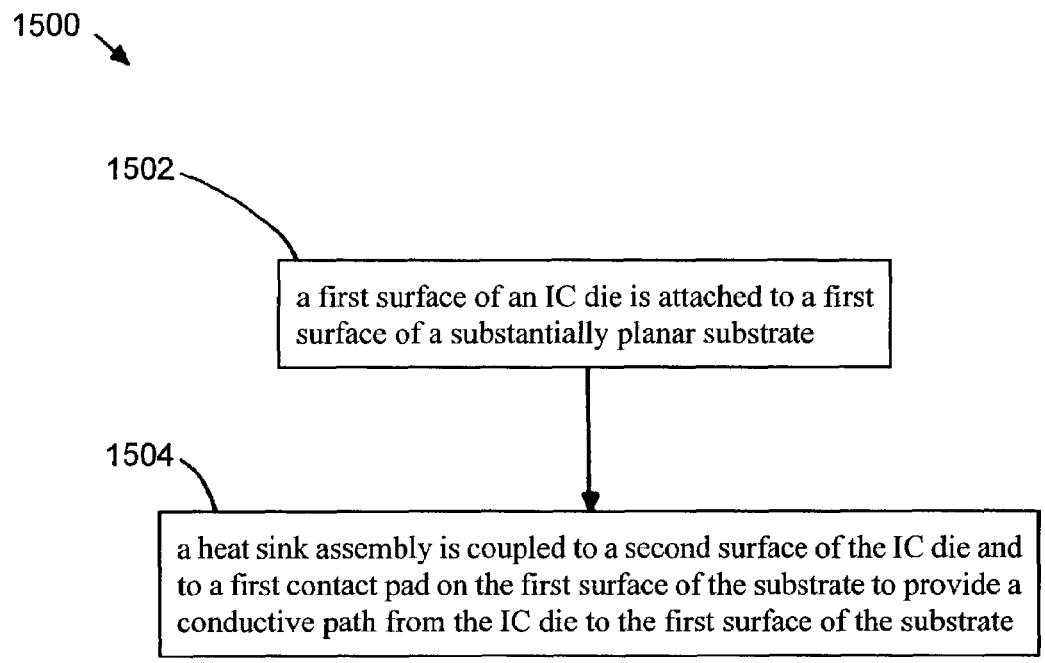
FIGS. 15A and 15B show flowcharts that provide example steps for assembling embodiments of the present invention.
Figure 15B:
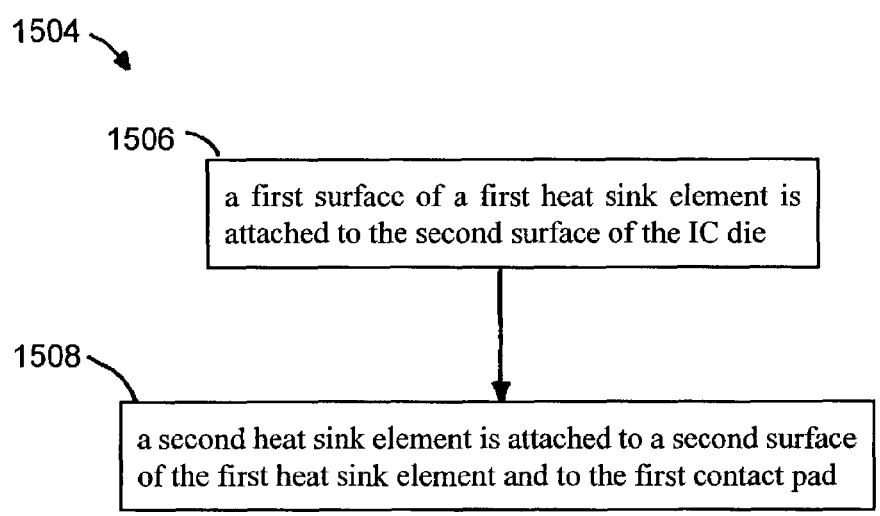

FIG. 15A shows a flowchart 1500 providing steps for assembling one or more embodiments of the present invention. FIG. 15B shows additional steps for assembling embodiments of the present invention. The steps of FIGS. 15A and 15B do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

Flowchart 1500 begins with step 1502. In step 1502, a first surface of an IC die is attached to a first surface of a substantially planar substrate. For example, the IC die is IC die 304, and the substrate is substrate 302. As shown in FIG. 7A, IC die 304 is attached to the top surface of substrate 304.

In step 1504, a heat sink assembly is coupled to a second surface of the IC die and to a first contact pad on the first surface of the substrate to provide a conductive path from the IC die to the first surface of the substrate. For example, the heat sink assembly is heat sink assembly 702. As shown in FIG. 7A, for example, heat sink assembly 702 is attached to the top surface of IC die 304, and to contact pad 720 on the surface of substrate 302. An electrically and/or thermally conductive path is provided through heat sink assembly 702 to substrate 302. Further examples of heat sink assembly 702 of the present invention are shown in FIGS. 7C–7G, 8A–8E, 9A, 9B, 10A, 10B, 11A, 13A–13D, and 14.

In embodiments, step 1504 includes the step where an electrically conductive path is formed from a first I/O pad of said IC die to the first contact pad. For example, as shown in FIG. 7A, a wire bond 712 electrically couples an I/O pad 712 of IC die 304 to heat sink assembly 702, which in turn electrically couples the I/O pad 712 to contact pad 720. Alternatively, FIG. 11A shows an embodiment, where a conductive bump 1102 of heat sink assembly 702 is electrically coupled to an I/O pad (not shown) of IC die 304 through a passivation opening. Heat sink assembly 702, in turn, electrically couples the I/O pad to contact pad 720.

In a two-heat sink element embodiment, step 1504 may include the steps shown in FIG. 15B. In step 1506 of FIG. 15B, a first surface of a first heat sink element is attached to the second surface of the IC die. For example, the first heat sink element is first heat sink element 704 shown in FIG. 7A. As shown in FIG. 7A, first heat sink element 704 is attached to the top surface of IC die 304.

In step 1508, a second heat sink element is attached to a second surface of the first heat sink element and to the first contact pad. For example, the second heat sink element is second heat sink element 706. As shown in FIG. 7A, second heat sink element 706 is attached to the top surface of first heat sink element 704, and to contact pad 720.

In an embodiment, step 1502 may include the step where the IC die is mounted on a substrate, and first heat sink element 704 with pre-formed conductive bumps is mounted on the IC die in a flipped orientation.

Step 1502 may include the step where a conductive bump on a surface of the heat sink assembly is electrically coupled to an I/O pad of the IC die through a passivation opening in the second surface of the IC die, as described above.

In a single heat sink element embodiment, step 1504 may include the step where a heat sink element is attached to the second surface of the IC die and to the first contact pad on the surface of the substrate. For example, the single heat sink element may be single heat sink element 802 or 804, shown in FIGS. 8A and 8B, respectively. As shown in FIG. 8A, heat sink element 802 is coupled to the top surface of IC die 304, and to contact pad 808. As shown in FIG. 8B, heat sink element 804 is coupled to the top surface of IC die 304, and to contact pad 812.

Further steps for assembling embodiments of the present invention will be apparent to persons skilled in the relevant art(s) from the teachings herein.

Summary of Some Advantages of the Present Invention

A number of the advantages of the integrated circuit package of the present invention are further described as follows:

(1) Short wire bond lengths: Short wire bonds reduce the inductance and resistance of the package. For example, in conventional BGA packages, ground rings are formed a particular distance from the IC die on the package substrate so that they are not contacted by an overflow of the IC die attach epoxy. Hence, an example minimum wire bond length for a ground signal is around 1.0 mm. According to the present invention, the inner wire bonds can be shorter because a ground ring can be formed on the first heat sink element. Furthermore, when an adhesive tape is used to attach the IC die to the first heat sink element, there is no concern for epoxy flow.

(2) Low inductance and resistance and voltage drop: Since the length of inner wire bonds are less than conventional wire bonds, the inductance and resistance of the inner wire bonds is also lower. Thus, as described above, the voltage drop is also reduced. Several factors contribute to this benefit: (a) Short inner wire bonds for ground or power; (b) shorter wire bonds to the package substrate because at least one ring (e.g., the ground ring) is moved to the first heat sink element; and (c) a bulk metal material is used for the second heat sink element.

(3) Lower core power IR drop: A first heat sink element with metal bumps thereon allows for a more direct connection from the IC die core to the second heat sink element, thus reducing the voltage drop for core power.

(4) Additional power rings: By removing a ring (e.g., a ground or power ring) from the package substrate, more area is available on the package substrate for additional substrate and rings. For example, an additional power ring may be formed on the package substrate.

(5) Fewer wire bonds needed for power: Shorter wire bonds have a lower inductance value, which helps to reduce the package voltage drop. In some conditions, the number of wire bonds is based on a calculated allowable voltage drop. The heat sink assembly of the present invention can significantly decrease the number of required wire bonds, making it easier to meet voltage drop requirements.

(6) Lower inductance for wire bonds: Alternative bonding of power and ground wires to the first heat sink element. By using equal length and parallel wire bonds, the wire bond inductance is reduced. The coupling between ground and power wires also benefits package performance.

(7) Reduced required IC die size: Because the number of required power and/or ground wire bonds is reduced in the package of the present invention, the required IC die size can be decreased, because IC dies with fewer I/O pads may be used.

(8) Improved performance: The reduced wire bond lengths of the present invention leads to improved performance of the I/O signals from the IC die. This is due to a number of factors, including lower inductance and resistance, less susceptibility to noise, decreased signal path distance, etc.

(9) Improved routability: Because one or more rings may be removed from the package substrate, there is more area on the package substrate to position bond fingers, vias, and traces for routing. Furthermore, more bond fingers may be positioned on the substrate with the same maximum wire bond length restriction.

(10) Reduced package body size: A reduced package body size is possible because of the improved routability of the package, as described above.

(11) Fewer substrate layers required: Fewer substrate layers may be used because of the benefits of lower inductance and resistance, improved routability, and enhanced thermal performance described herein.

(12) Flexible IC die pad layout design: Ground and/or power bond pads used for inner wire bond attachment can be placed at an inner row of bond pads on the IC die top surface. This greatly increases IC die design flexibility. For example, in conventional BGA packages, ground and power bond pads are often required to be placed at the outer row of IC die bond pads.

(13) Enhanced thermal performance: The package of the present invention operates very efficiently to spread heat from the IC die.

(14) Improved shielding: Second heat sink element 706 effectively shields signals inside the package, and minimized electromagnetic interference (EMI).

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An integrated circuit (IC) package, comprising:
   a substantially planar substrate having a plurality of contact pads on a first surface electrically connected through said substrate to a plurality of solder ball pads on a second surface of said substrate;
   an IC die having a first surface mounted to said first surface of said substrate, wherein said IC die has a plurality of I/O pads electrically connected to said plurality of contact pads on said first surface of said substrate; and
   a heat sink assembly coupled to a second surface of said IC die and to a first contact pad on said first surface of said substrate to provide a thermal path from said IC die to said first surface of the substrate;
   wherein the heat sink assembly includes:
      a first heat sink element that has a first surface and a second surface, wherein said first surface of said first heat sink element is attached to said second surface of said IC die, and wherein said second surface of said first heat sink includes at least one bond pad; and
      a second heat sink element coupled to said second surface of said first heat sink element and to said first contact pad.

2. The package of claim 1, wherein said heat sink assembly provides an electrically conductive path from a first I/O pad of said IC die to said first contact pad.

3. The package of claim 2, wherein said first contact pad is electrically coupled to at least one solder ball pad located on said second surface or said substrate substantially opposite of said first contact pad on said first surface of said substrate.

4. The package of claim 1, wherein said heat sink assembly is attached to a central portion of said second surface of said IC die within a boundary of said plurality of I/O pads on said second surface of said IC die.

5. The package of claim 1, wherein said first heat sink element and said second heat sink element are electrically coupled to provide an electrically conductive pad from a first I/O pad of said IC die to said first contact pad.

6. The package of claim 1, wherein said heat sink assembly further includes:
   a thermally and electrically conductive adhesive layer that attaches a surface of said second heat sink element to said second surface of said first heat sink element.

7. The package of claim 1, further comprising:
   a wire bond;
   wherein said second surface of said first heat sink element has a contact area, wherein said at least one bond pad is electrically coupled to said contact area, wherein said wire bond couples an I/O pad on said second surface of said IC die to said at least one bond pad; and
   wherein said second heat sink element is electrically coupled to said contact area.

8. The package of claim 7, wherein said second surface of said first heat sink element further has a second bond area and a second contact area, wherein said second bond area is electrically coupled to said second contact area;
   wherein said first contact area is electrically isolated from said second contact area.

9. The package of claim 8, wherein said second heat sink element includes:
   a first arm portion attached to said first contact area and said first contact pad on said first surface of said substrate; and
   a second arm portion attached to said second contact area and a second contact pad on said first surface of said substrate.

10. The package of claim 9, further comprising:
    a second wire bond that electrically couples a secon I/O bond pad on said second surface of said IC die to said second bond area.

11. The package of claim 10, wherein said first I/O bond pad is coupled to a second signal source in said IC die.

12. the package of claim 11, wherein said first arm portion electrically couples said first I/O bond pad to said first contact pad; and
    wherein said second arm portion electrically couples said second I/O bond pad to said second contact pad.

13. The package of claim 4, wherein said second surface of said first heat sink element has a plurality of bond areas and a plurality of contact areas, wherein each bond area of said plurality of bond areas is electrically coupled to a contact area of said plurality of contact areas;
    wherein said plurality of contact areas are electrically isolated from each other; and
    wherein said second heat sink element has a plurity of portions that are each electrically coupled to a respective contact area of said plurality of contact areas.

14. the package of claim 4, wherein said second heat sink element includes opposed first and second surfaces, wherein the first surface of saied second heat sink element is coupled to said second surface of said first heat sink element; and
    wherein said second heat sink element includes at least one perforation that opens from said first surface of said second heat sink element to said second surface of said second heat sink element.

15. The package of claim 14, further comprising:
    a thermally conductive adhesive material that substantially fills said at least one perforation and attaches said first surface of said second heat sink element to said second surface of said first heat sink element.

16. the package of claim 1, further comprising:
    an encapsulate material that encapsulates said IC die and said heat sink assembly on said first surface of said substrate.

17. The package of claim 4, further comprising:
    an encapsulate material that encapsulates said IC die, said first heat sink element, and a portion of said second heat sink element on said surface of said substrate.

18. The package of claim 1, wherein said second heat sink element is attached to said first contact pad by an electrically and thermally conductive layer.

19. The package of claim 1, wherein said second heat sink element has an M-shaped cross-section.

20. The package of claim 4, wherein said second heat sink element has a substantially planar central region coupled to said second surface of said first heat sink element, and wherein said second heat sink element has a plurality of arms that extend from said central region.

21. The package of claim 20, wherein said central region is recessed.

22. The package of claim 20, wherein a first arm of said plurality of arms includes a first portion and a second portion coupled in series, wherein said first portion extends from said central region in a first direction to allow said first ann to avoid contact with a wire bond coupled to said IC die, and wherein said second portion of said first ann extends in a second direction to allow said first arm to contact said first contact pad on said first surface of said substrate.

23. The package of claim 4, wherein said second heat sink element comprises a metal.

24. The package of claim 4, wherein said first heat sink element comprises silicon.

25. The package of claim 4, wherein said first heat sink element comprises a metal.

26. The package of claim 4, wherein said first heat sink element comprises a tape substrate that has at least one conductive layer.

27. The package of claim 1, wherein said first heat sink element comprises a printed circuit board (PCB) material.

28. The package of claim 1, wherein said heat sink assembly includes:
a heat sink element that is coupled to said second surface of said IC die and to said first contact pad on said first surface of said substrate 29. The package of claim 28, further comprising:
a wire bond that couples an I/O bond pad on said second surface of said IC die to said heat sink element.

30. The package of claim 28, wherein said heat sink element includes opposed first and second surfaces; and
wherein said heat sink element includes at least one perforation that opens from said first surface of said heat sink element to said second surface of said heat sink element.

31. The package of claim 30, further comprising:
a thermally conductive adhesive material that substantially fills said at least one perforation and attaches said first surface of said heat sink element to said surface of said IC die.

32. The package of claim 28, further comprising:
an encapsulate material that encapsulates said IC die and said heat sink element on said first surface of said substrate.

33. The package of claim 28, further comprising:
an encapsulate material that encapsulates said IC die and a portion of said heat sink element on said surface of said substrate.

34. The package of claim 28, wherein said heat sink element has a first arm and a second arm, wherein said first arm is coupled to said first contact pad on said first surface of said substrate, and wherein said second arm is coupled to a second contact pad on said first surface of said substrate.

35. The package of claim 34, wherein said first arm is electrically isolated from said second arm.

36. The package of claim 35, further comprising:
a first wire bond that couples a first I/O bond pad on said second surface of said IC die to said first arm; and
a second wire bond that couples a second I/O bond pad on said second surface of said IC die to said second arm.

37. The package of claim 36, wherein said first arm portion electrically couples said first I/O bond pad to said first contact pad; and
wherein said second arm portion electrically couples said second I/O bond pad to said second contact pad.

38. The package of claim 36, wherein said first I/O bond pad is coupled to a first signal source in said IC die, and said second I/O bond pad is coupled to a second signal source in said IC die.

39. The package of claim 28, wherein said heat sink element has an M-shaped cross-section.

40. The package of claim 28, wherein said heat sink element has a substantially planar central region coupled to said second surface of said IC die and a plurality of arms that extend from said central region.

41. The package of claim 40, wherein said central region is recessed.

42. The package of claim 41, wherein a first arm of said plurality of arms includes a first portion and a second portion coupled in series, wherein said first portion extends from said central region in a first direction to allow said first arm to avoid contact with a wire bond coupled to said IC die, and wherein said second portion of said first arm extends in a second direction to allow said first arm to contact said first contact pad on said first surface of said substrate.

43. The package of claim 28, wherein said heat sink element comprises a metal.

44. The package of claim 1, wherein said IC die is mounted to said first surface of said substrate in a flip chip orientation.

45. The package of claim 1, wherein said heat sink assembly has a surface that includes a conductive bump, wherein said surface of said heat sink assembly is attached to said second surface of said IC die, wherein said conductive bump is electrically coupled to a first I/O pad of said IC die through a passivation opening in said second surface of said IC die.

46. The package of claim 1, further including a thermally conductive adhesive layer that attaches said heat sink assembly to said second surface of said IC die.

47. The package of claim 28, wherein said heat sink element is attached to said first contact pad by an electrically and thermally conductive layer.

* * * * *